United States Patent
Imada et al.

(10) Patent No.: US 6,222,302 B1
(45) Date of Patent: *Apr. 24, 2001

(54) PIEZOELECTRIC ACTUATOR, INFRARED SENSOR AND PIEZOELECTRIC LIGHT DEFLECTOR

(75) Inventors: Katsumi Imada, Katano; Katsunori Moritoki, Takatsuki; Takeshi Masutani, Moriguchi; Kouji Nomura, Shijonawate; Kouji Kawakita, Joyo, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,348

(22) Filed: Sep. 30, 1998

(30) Foreign Application Priority Data

Sep. 30, 1997 (JP) .................................................. 9-267087
Sep. 9, 1998 (JP) ................................................. 10-255049

(51) Int. Cl.$^7$ .................................................. H01L 41/08
(52) U.S. Cl. .......................................... 310/321; 310/330
(58) Field of Search ........................... 310/321, 330–332, 310/328, 366

(56) References Cited

U.S. PATENT DOCUMENTS

| 3,370,187 | * | 2/1968 | Straube | 310/330 |
| 4,140,936 | * | 2/1979 | Bullock | 310/328 |
| 4,524,294 | * | 6/1985 | Brody | 310/330 X |
| 4,595,338 | * | 6/1986 | Kolm et al. | 310/330 X |
| 4,742,264 | * | 5/1988 | Ogawa | 310/366 X |
| 4,759,107 | * | 7/1988 | Ogawa et al. | 310/366 X |
| 4,780,062 | * | 10/1988 | Yamada et al. | 310/321 X |
| 4,812,698 | * | 3/1989 | Chida et al. | 310/330 |
| 5,008,582 | * | 4/1991 | Tanuma et al. | 310/330 X |
| 5,446,485 | * | 8/1995 | Usui et al. | 310/366 X |
| 5,629,483 | * | 5/1997 | Nakamura et al. | 310/321 X |
| 5,828,157 | * | 10/1998 | Miki et al. | 310/321 X |
| 5,861,703 | * | 1/1999 | Losinski | 310/330 |

FOREIGN PATENT DOCUMENTS

| 0739 083 A1 | 11/1995 | (EP) . |
| 59-32826 | 2/1984 | (JP) . |
| 62-8770 | 4/1987 | (JP) . |
| 9-154288 | 6/1997 | (JP) . |

* cited by examiner

Primary Examiner—Mark O. Budd
(74) Attorney, Agent, or Firm—Wenderoth, Lind & Ponack, L.L.P.

(57) ABSTRACT

The drive section made by bonding the piezoelectric material on part of the elastic shim and the displacement amplifying section which amplifies the amplitude of vibration vibrated in the drive section are provided in the same plane. The device is driven at drive frequencies in a region between the resonance frequency of the drive section and the resonance frequency of the displacement amplifying section.

49 Claims, 33 Drawing Sheets

PIEZOELECTRIC ACTUATOR, INFRARED SENSOR AND PIEZOELECTRIC LIGHT DEFLECTOR

BACKGROUND OF THE INVENTION

1. Field of the Invention

The present invention relates to a piezoelectric actuator, an pyroelectric infrared sensor and a piezoelectric light deflector which employ the piezoelectric actuator.

2. Description of Prior Art

Piezoelectric actuators, which make bending motion under the influence of a voltage applied across a piezoelectric element made by bonding a piezoelectric material onto thin elastic plates made of a metal or the like, are used in various devices including a chopper for a pyroelectric infrared sensor and a light deflector. Actuators of this type are classified into bimorph type where piezoelectric ceramic plates are bonded on both sides of a thin elastic plate, and unimorph type where a piezoelectric ceramic plate is bonded on only one side of a thin elastic plate, which are selected and used according to the application. When the piezoelectric actuators of bimorph type and unimorph type of the prior art are required to produce a large amount of displacement, applied voltage is increased or the frequency of the drive voltage is made equal to the resonance frequency of the element.

However, such methods lead to significantly increased strain of the piezoelectric oscillator which makes it impossible to achieve a high reliability.

There has also been such a problem that the element must be larger in size in order to achieve a large amount of displacement while minimizing the strain of the piezoelectric diaphragm.

While the piezoelectric actuator can be driven with a lower voltage by using resonance, this causes the drive section to vibrate with a larger amplitude which lowers the reliability, resulting in another problem that the displacement increases due to variations in the resonance.

For these reasons, it has been difficult for the piezoelectric actuators of bimorph type and unimorph type of the prior art to satisfy the requirements of decreasing the drive voltage, increasing the amount of displacement, improving the stability and reducing the size at the same time.

The pyroelectric infrared sensor, which has recently found wider applications such as measurement of food temperature in a microwave oven and locating people in a room for air-conditioning control, also employ piezoelectric actuators. The pyroelectric infrared sensor utilizes the pyroelectric effect of pyroelectric material such as single crystal of $LiTaO_3$ which can be explained simply as follows. A pyroelectric material undergoes spontaneous polarization and always has surface charges which, under stationary state in atmosphere, couple with charges in the atmosphere thereby to maintain electrical neutrality. When the pyroelectric material is irradiated with infrared ray, the pyroelectric material changes the temperature thereof thus bringing the surface charges out of the neutrality. The pyroelectric infrared sensor measures the intensity of the infrared ray by detecting the charges generated on the surface. In other words, every object emits infrared ray which corresponds to the temperature thereof, which can be measured with this sensor thereby to determine the temperature or the position of the object.

Since the pyroelectric effect occurs as the intensity of the incident infrared ray changes, the pyroelectric infrared sensor must change the intensity of the incident infrared ray. A chopper is usually used for this means, so that the infrared ray is incident on the pyroelectric material intermittently and accordingly the object temperature is measured. Pyroelectric infrared sensors of the prior art employ mainly choppers which is based on an electromagnetic motor, a piezoelectric actuator, etc.

FIG. 46 schematically shows an pyroelectric infrared sensor of the prior art which employs a piezoelectric actuator comprising piezoelectric ceramics bonded onto a thin elastic plate as a chopper.

In the pyroelectric infrared sensor of the prior art shown in FIG. 46, piezoelectric ceramic plates 311a, 311b are bonded on either side of an elastic shim 310 thereby constituting a bimorph type element. The piezoelectric ceramic plates 311a, 311b have electrodes formed on the surfaces thereof, and are made to polarize in the direction of thickness. Directions of polarization of the piezoelectric ceramic plates 311a, 311b are determined so that the piezoelectric ceramic plates 311a, 311b deform always in the opposite directions. That is, polarity of the applied voltage and the direction of polarization are determined so that one of the piezoelectric ceramic plates 311a, 311b expands while the other contracts. The bimorph type element is supported by a supporting member 313 and has, at the tip on a free end thereof, a shading plate 14 which is located between the incident light and the infrared sensor thereby to interrupt the incident light. The infrared sensor 315 is disposed in the vicinity of the bimorph type element in such an arrangement as the infrared sensor 315 does not touch the shading plate 314 and the bimorph type element.

When a voltage is applied across the elastic shim 310 and the piezoelectric ceramic plates 311a, 311b in the pyroelectric infrared sensor of the prior art made in such a configuration as described above, the bimorph type element makes bending motion while being fixed at one end thereof, while the shading plate 14 attached to the tip makes reciprocal motion as the direction of the electric field changes. The shading plate 314 making the reciprocal motion interrupts light beam 316 incident on the infrared sensor 315.

However, a chopper used in the pyroelectric infrared sensor must make a relatively large displacement. Therefore in the bimorph type piezoelectric chopper of the prior art, a large displacement is achieved by applying a higher voltage and setting the frequency of the drive voltage equal to the resonance frequency of the element, while employing such a construction as the piezoelectric oscillator is directly supported. This construction leads to a problem that the support portion of the piezoelectric chopper is subject to a significant strain which makes it difficult to achieve a high reliability in the support member. There has also been such a problem that the element must be larger in size in order to achieve a great amount of displacement while minimizing the strain of the piezoelectric oscillator.

While the piezoelectric actuator can be driven with a lower voltage by using resonance, this causes the drive section to vibrate with a larger amplitude which lowers the reliability, thus resulting in another problem that the displacement increases due to variations in the resonance.

For these reasons, it has been difficult for the piezoelectric actuators of bimorph type and unimorph type of the prior art to satisfy the requirements to decrease the drive voltage, increase the displacement, improve the stability and reduce the size at the same time.

Recently, in the trend toward sophistication of physical distribution systems, the bar code is extensively used to control the commodities based on digital data. A bar code reader used to read the bar code directs a laser beam to the bar code and detects the pattern of the reflected light, thereby reading the information from the bar code. As such, the bar code must have a mechanism for deflecting the laser beam generated by a laser source. While a deflector based on a 2-pole motor having a reflector have been used, light deflectors based on the piezoelectric effect have recently been put into practical use in order to make apparatuses that incorporate the light deflector smaller in size.

As light deflectors based on the piezoelectric effect, V. J. Fowler & J. Schlafer, Proc. IEEE.,Vol.54 (1966), pp1437 discloses one that comprises an actuator made by laminating piezoelectric elements and attaching a mirror thereto wherein the direction of the mirror is controlled by applying a voltage to the actuator (hereinafter called first light deflector of the prior art).

There are various types in addition to that described above. For example, In Japanese Non-examined Patent Publication No. 58-95710 there is disclosed another light deflector which deflects the direction of light by rotating a mirror by means of a bimorph actuator (hereinafter called second light deflector of the prior art). In Japanese Non-examined Patent Publication No.58-189618 there is disclosed a light deflector having a bimorph actuator with electrodes divided into a plurality of parts which controls the amount of deformation by controlling the number of electrodes whereon voltages are applied (hereinafter called third light deflector of the prior art).

The first light deflector of the prior art has such a problem as the angle of deflecting the light with respect to the applied voltage cannot be increased sufficiently because an actuator of laminated elements is used.

The second light deflector of the prior art has such a problem as extremely complicated construction because a plurality of bimorph actuators and a rotating shaft of the mirror are mechanically coupled.

The light deflector of the prior art has such a problem as a complex process is required to control the amount of deflection.

SUMMARY OF THE INVENTION

The piezoelectric actuator, the infrared sensor and the piezoelectric light deflector of the prior art have such problems as described above.

That is, a first object of the present invention is to provide a piezoelectric actuator capable of achieving a large amount of displacement with a low driving voltage, high stability of operation and small size.

A second object of the present invention is to provide a pyroelectric infrared sensor which employs the piezoelectric actuator and achieves high reliability.

A third object of the present invention is to provide a piezoelectric light deflector of a simple construction which allows easy control of the amount of deflection and capable of achieving a large deflection angle.

In order to achieve the object described above, the piezoelectric actuator according to the present invention comprises a drive section which is made by bonding a piezoelectric diaphragm expanding and contracting in one direction perpendicular to the direction of thickness in correspondence to a voltage applied across the thickness and a thin elastic plate and undergoes alternating deflection at a frequency corresponding to the frequency of the drive voltage, and a displacement amplifying section which is, being disposed in a same plane as the drive section, capable of vibrating in synchronization with the flexural oscillation of the drive section and is connected with the drive section to be vibrated by the vibration of the drive section thereby to amplify the vibration of the drive section, wherein vibration of the drive section is amplified by the displacement amplifying section.

In the piezoelectric actuator, it is preferable that the displacement amplifying section is made of a thin elastic plate and the thin elastic plate formed integrally with the thin elastic plate of the drive section, so that the displacement amplifying section is effectively vibrated by the vibration of the drive section.

In the piezoelectric actuator, it is also preferable that one end of the displacement amplifying section is connected with one end of the thin elastic plate of the drive section.

Such a configuration makes it possible to maximize the effective length of the element and to ensure a large displacement with a lower drive voltage.

In this case, the piezoelectric actuator may also be supported by the other end of the thin elastic plate of the drive section. This configuration makes it possible to vibrate the primary mode of flexural oscillation with one end fixed, thereby making the displacement greater than the case without support.

The piezoelectric actuator may also be supported at the connecting portion between the thin elastic plate of the drive section and the displacement amplifying section. This configuration also makes it possible to vibrate the primary mode of flexural oscillation with one end fixed, thereby making the displacement greater than the case without support.

The configuration also makes it easier to design the resonance frequency because there is only negligible interaction between the thin elastic plate of the drive section and the displacement amplifying section during design.

Further in the piezoelectric actuator, it is preferable that the piezoelectric diaphragm be made by alternately laminating electrode layers and piezoelectric layers with the electrode layers making the top and bottom layers with a drive voltage applied to each piezoelectric layer via the electrode layers disposed at the top and bottom thereof.

This configuration makes it possible to greatly reduce the drive voltage while maintaining the amount of displacement. That is, greater displacement can be achieved with a lower drive voltage.

In case the piezoelectric diaphragm is made in a laminated structure, it is preferable that one of the pair of electrode layers which interpose the piezoelectric layer of the piezoelectric diaphragm is formed so that one side face thereof is located inside of one side face of the piezoelectric diaphragm and the other electrode layer is formed so that one side face thereof is located inside of the other side face of the piezoelectric diaphragm.

Also in case the piezoelectric diaphragm is made in a laminated structure, it is more preferable that one of the pair of electrode layers which interpose the piezoelectric layer of the piezoelectric diaphragm is formed so that one edge thereof is located inside of one edge of the piezoelectric diaphragm and the other electrode layer is formed so that one edge thereof is located inside of the other edge of the piezoelectric diaphragm.

Also in case the piezoelectric diaphragm is made in a laminated structure, it is more preferable that each electrode layer is formed so that both edges of the each electrode layer are located inside of edge of said piezoelectric diaphragm.

These configurations make it possible to prevent short-circuiting from taking place between the electrodes when cutting the piezoelectric diaphragm to specified size. Electrode migration can also be prevented from taking place during driving. It is also made possible to improve the chipping when cutting off the piezoelectric diaphragm.

In case the piezoelectric diaphragm is made in a laminated structure, it is preferable that each of the electrode layers has a protruding electrode on one edge thereof while the edge and the side face of the electrode layer are located inside the edge and the side face of the piezoelectric diaphragm except for the tip of the protruding electrode is exposed to one edge of the piezoelectric diaphragm, and the protruding electrode is connected to a connection electrode formed on every other edge of the piezoelectric diaphragm. This configuration makes it possible to connect between the electrodes easily and reduce the production cost because of easy production process.

In this case, it is preferable that an insulator or a hole be formed, for the insulation between the connection electrode and the thin elastic plate of the drive section, at a position where one of the connection electrodes provided on the thin elastic plate of the drive section is located when the thin elastic plate of the drive section and the piezoelectric diaphragm are bonded with each other. This allows reliable insulation between one of the connection electrode and the thin elastic plate of the drive section, thus improving the reliability. This configuration also makes it possible to prevent electrode migration during driving. Also-because the production process is made easier, production cost can be reduced. Moreover, it is also made possible to form the connection electrodes after bonding the piezoelectric diaphragm and the thin elastic plate of the drive section.

In case the piezoelectric diaphragm is made in a laminated structure, it is preferable that each of the electrode layers has a protruding electrode on one side face thereof while the edge and the side face of the electrode layer are located inside the edge and the side face of the piezoelectric diaphragm except for the tip of the protruding electrode, which is exposed to one side face of the piezoelectric diaphragm, and the protruding electrode, which is connected to a connection electrode formed on every other edge of the piezoelectric diaphragm. Such a configuration also has the effect similar to that of the case where the connection electrode is formed on the edge of the piezoelectric diaphragm.

In case the connection electrode is formed on the side face as described above, it is preferable that the thin elastic plate of the drive section is smaller than the piezoelectric diaphragm in width, and the thin elastic plate of the drive section and the piezoelectric diaphragm be bonded so that one side face of the thin elastic plate of the drive section is located inside the side face of the piezoelectric diaphragm, thus making it easier to insulate the connection electrode and the thin elastic plate of the drive section.

In case the connection electrode is formed on the side face as described above, one of the connection electrodes and the thin elastic plate of the drive section may also be insulated by forming a notch, for the insulation between the connection electrode and the thin elastic plate of the drive section, at a position where one of the connection electrodes provided on the thin elastic plate of the drive section is located when the thin elastic plate of the drive section and the piezoelectric diaphragm are bonded with each other.

In case the connection electrode is formed on the side face as described above, one of the connection electrodes and the thin elastic plate of the drive section may also be insulated by forming a notch, for the insulation between the connection electrode and the thin elastic plate of the drive section, at a position where one of the connection electrodes provided on the thin elastic plate of the drive section is located when the thin elastic plate of the drive section and the piezoelectric diaphragm are bonded with each other.

In case the connection electrode is formed on the side face as described above, one of the connection electrodes and the thin elastic plate of the drive section may also be insulated by forming a notch, for the insulation between the connection electrode and the thin elastic plate of the drive section, at a position where one of the connection electrodes provided on the thin elastic plate of the drive section is located when the thin elastic plate of the drive section and the piezoelectric diaphragm are bonded with each other.

Also in case the connection electrode is formed on the side face as described above, an insulator may be formed for the insulation between the connection electrode and the thin elastic plate of the drive section, at a position where one of the connection electrodes provided on the thin elastic plate of the drive section is located when the thin elastic plate of the drive section and the piezoelectric diaphragm are bonded with each other.

Further in case the piezoelectric diaphragm is made in a laminated structure, it is preferable that each of the electrode layers has a protruding electrode for connecting between the electrode layers on one edge of the piezoelectric diaphragm and the protruding electrodes are disposed to oppose each other in a staggered arrangement, while the opposing electrodes are connected with each other by means of a connection electrode formed in a through hole.

This configuration makes it possible to connect the electrodes with each other more easily and surely than a case where the electrodes are connected with each other by means of connection electrodes formed on an edge or a side face of the piezoelectric diaphragm. Even in case the connection electrodes are formed before bonding the piezoelectric diaphragm and the thin elastic plate of the drive section, the piezoelectric diaphragm can be reliably bonded without damage from a relatively high pressure (approximately 5 kg/cm$^2$) applied during bonding.

In the piezoelectric actuator, it is preferable that the connection electrode and a surface electrode formed on a surface opposite to that on which the piezoelectric diaphragm is bonded onto the thin elastic plate of the drive section, and one surface electrode and the other surface electrode be insulated from each other.

This configuration makes it possible to achieve more reliable continuity even under adverse conditions compared to a case of contact connection where the surface electrode of the piezoelectric diaphragm and the thin elastic plate of the drive section are connected by interposing the adhesive layer, thus providing a more reliable actuator.

The piezoelectric actuator may also be made by forming an electrode on another surface electrode formed on a surface of the piezoelectric diaphragm where it is bonded onto the thin elastic plate of the drive section, with both electrodes being insulated, while connecting one of the connection electrodes to the surface electrode and connecting the other connection electrode to the electrode formed on the surface electrode.

In this case, it is preferable that the electrode be formed on the thin elastic plate of the drive section with an insulation layer interposed therebetween so that the electrode opposes the other electrode when the piezoelectric diaphragm and the thin elastic plate of the drive section are bonded to each other, and the drive voltage be applied across the electrode and the thin elastic plate of the drive section.

This configuration makes it possible to drive the piezoelectric actuator by applying a voltage across the thin elastic plate of the drive section and the electrode which is formed on the thin plate and is insulated from the thin plate by means of a connector, for example, without running a wire or the like from the piezoelectric diaphragm as in such a configuration that the drive voltage is applied between the surface electrode of the piezoelectric diaphragm and the thin elastic plate of the drive section. Thus a wire bonding step which accounts for a significant portion of the production cost can be eliminated and the production cost can be greatly reduced.

The piezoelectric actuator may also be made in such a configuration as the electrode layer and the piezoelectric layer are alternately laminated in the direction of width (transversal direction) of the piezoelectric diaphragm so that both side faces of the piezoelectric diaphragm become electrode layers, and the drive voltage is applied to the piezoelectric diaphragm via the electrode layers which interpose the piezoelectric diaphragm.

This configuration makes it possible to reduce the drive voltage greatly while maintaining the amount of displacement.

The piezoelectric actuator may also be made in such a configuration as the electrode layer and the piezoelectric layer are alternately laminated in the longitudinal direction of the piezoelectric diaphragm so that both edges of the piezoelectric diaphragm become electrode layers, and the drive voltage is applied to the piezoelectric diaphragm via the electrode layers which interpose the piezoelectric diaphragm. This makes it possible to use a piezoelectric constant d33 which is greater than a piezoelectric constant d31, and thereby decrease the drive voltage further.

In the piezoelectric actuator, it is preferable that a pair of electrodes having a potential difference be formed on the thin elastic plate of the drive section with an insulation layer interposed therebetween, and the drive voltage be applied to the piezoelectric diaphragm by using the electrodes. This makes it unnecessary to lead from the electrodes by means of wires thereby reducing the production cost, and makes it possible to mitigate the changes in the actuator characteristics due to an extraneous force acting on the piezoelectric actuator and solder used in bonding the wire onto the electrode which may have adverse effects depending on the shape of-the wire attached to the electrode.

In the piezoelectric actuator, in order to achieve stable oscillation, it is preferable to set the resonance frequency of the drive section and the resonance frequency of the displacement amplifying section so that the lower frequency is 0.6 times the higher frequency, and set the frequency of the drive voltage to a value between the resonance frequency of the drive section and the resonance frequency of the displacement amplifying section. These settings cause the resonance of the drive section and the resonance of the displacement amplifying section to give great influence to each other, resulting in a great amount of displacement.

In the piezoelectric actuator, it is preferable to set the frequency of the drive voltage within a stable region where no substantial change is caused in the displacement by a change in the frequency, in order to minimize the fluctuation of the output displacement due to a change in the drive voltage frequency.

Also in the piezoelectric actuator, it is preferable to set the resonance frequency of the displacement amplifying section lower than the resonance frequency of the drive section, in order to improve the temperature characteristic of the output displacement (reduce the change in the output displacement caused by a change in the temperature).

Also in the piezoelectric actuator, the resonance frequency of said displacement amplifying section may be set higher than the resonance frequency of said drive section.

Further in the piezoelectric actuator, it is preferable to set the resonance frequency of the drive section higher than the resonance frequency of the displacement amplifying section and set the frequency of the drive voltage equal to the resonance frequency of the displacement amplifying section, in order to make the drive section vibrate with a relatively small amplitude and the displacement amplifying section vibrate with a large amplitude. This makes it possible to produce a large amount of output displacement while minimizing the displacement of the drive section, thus providing a piezoelectric actuator having high reliability and large amount of displacement.

In this case, it is preferable to set the resonance frequency of the drive section to a value 1.5 times the frequency of the drive voltage or higher, and set the resonance frequency of the displacement amplifying section to a value near to the frequency of the drive voltage. These settings make it possible to suppress the displacement of the drive section to a further lower value and produce a large amount of output displacement, thus providing a piezoelectric actuator having high reliability and large amount of displacement.

In order to achieve the object, the pyroelectric infrared sensor according to the present invention comprises a chopper comprising the piezoelectric actuator and a shading plate disposed in a substantially perpendicular direction at the displacement amplifying section or junction of the piezoelectric actuator, and an infrared sensor having an infrared ray receiver arranged so that the shading plate is located in front of the infrared ray receiver, wherein the piezoelectric actuator is driven to operate by a drive voltage of a predetermined frequency thereby to have infrared ray incident intermittently on the infrared sensor The pyroelectric infrared sensor of the present invention, made in the configuration described above, can be made compact and have high reliability since the chopper comprising the piezoelectric actuator and the shading plate disposed in a substantially perpendicular direction at the displacement amplifying section or junction of the piezoelectric actuator is provided.

In order to achieve the object, the piezoelectric light deflector according to the present invention comprises the piezoelectric actuator and a reflector disposed substantially parallel to the displacement amplifying section in at least a part of the displacement amplifying section of the piezoelectric actuator, wherein the piezoelectric actuator is driven to operate by a drive voltage of a predetermined frequency thereby to change the direction of light reflected by the reflector.

The piezoelectric light deflector of the present invention, made in the configuration described above, can be made in a simple construction, allows easy control of the amount of deflection and achieves a large deflection angle of light, because it is provided with the piezoelectric actuator and a reflector disposed substantially parallel to the displacement amplifying section in at least a part of the displacement amplifying section of the piezoelectric actuator.

DETAILED DESCRIPTION OF THE PREFERRED EMBODIMENTS

Now preferred embodiments of the present invention will be described below with reference to the accompanying drawings.

Embodiment 1

Figure 1:
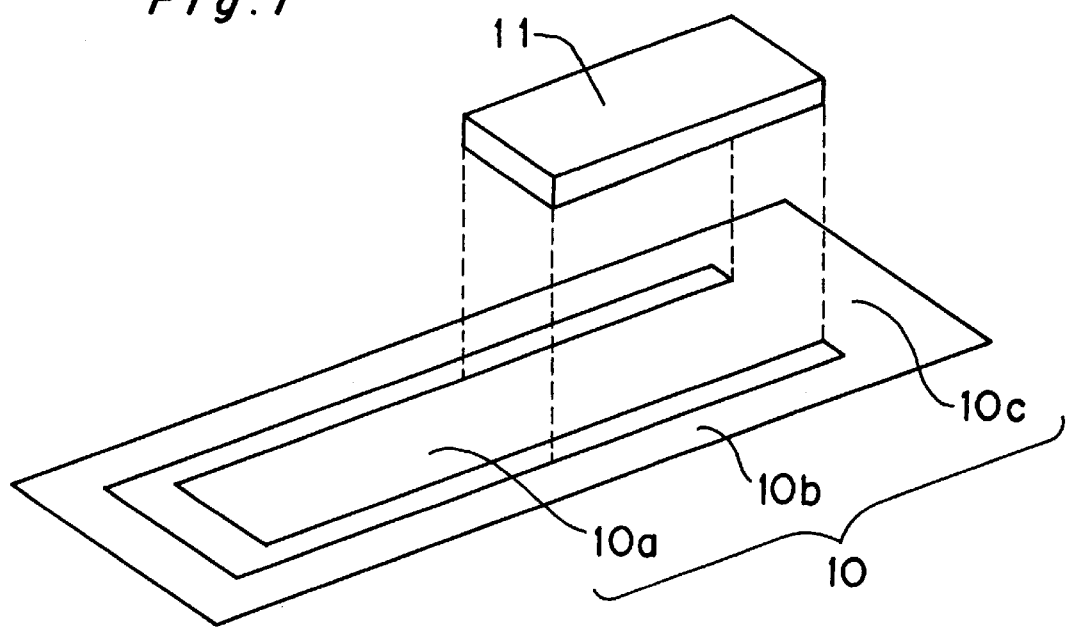
FIG. 1 is an exploded perspective view showing the configuration of the piezoelectric actuator according to the first embodiment of the present invention.

FIG. 1 is an exploded perspective view showing the construction of a piezoelectric actuator according to the first embodiment of the present invention. The piezoelectric actuator of the first embodiment comprises an elastic shim 10 made by connecting a thin elastic plate of the drive section 10a and a thin elastic plate constituting a displacement amplifying section 10b at a connecting portion 10c, and a piezoelectric diaphragm 11 bonded onto a part of the thin elastic plate of the drive section 10a, as shown in FIG. 1.

Figure 2:
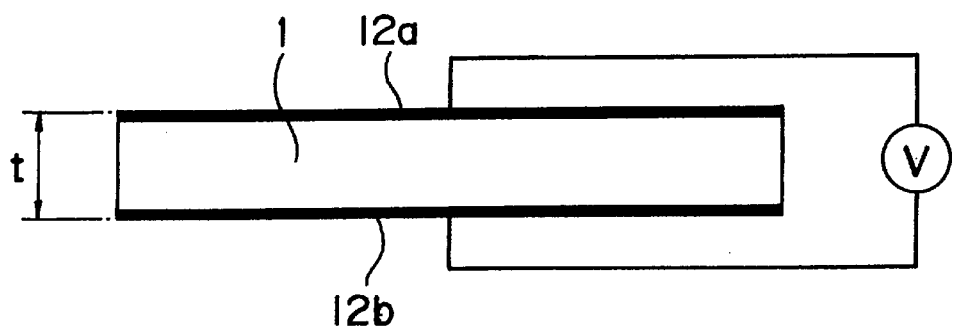
FIG. 2 is a schematic diagram showing the configuration of the piezoelectric diaphragm 1 used in the piezoelectric actuator shown in FIG. 1.

The piezoelectric diaphragm 11 is made by forming electrodes 12a, 12b on a principal surface opposing a piezoelectric ceramic plate 1 which is polarized in the direction of thickness as shown in FIG. 2, and expands or contracts in the longitudinal direction thereof, when a drive voltage is applied via the electrodes 12a, 12b, depending on the polarity of the drive voltage. Thus a drive section 100 of unimorph type comprising the thin elastic plate of the drive section 10a and the piezoelectric diaphragm 11 undergoes flexural oscillation according to the drive voltage applied. In the piezoelectric actuator of the first embodiment, vibration characteristic of the displacement amplifying section 10b is set so as to vibrate in synchronization with the flexural oscillation of the drive section 100. Thus the displacement amplifying section 10b is driven to vibrate by the vibration of the drive section 100 at the same frequency therewith via the connecting portion 10c.

Figure 3:
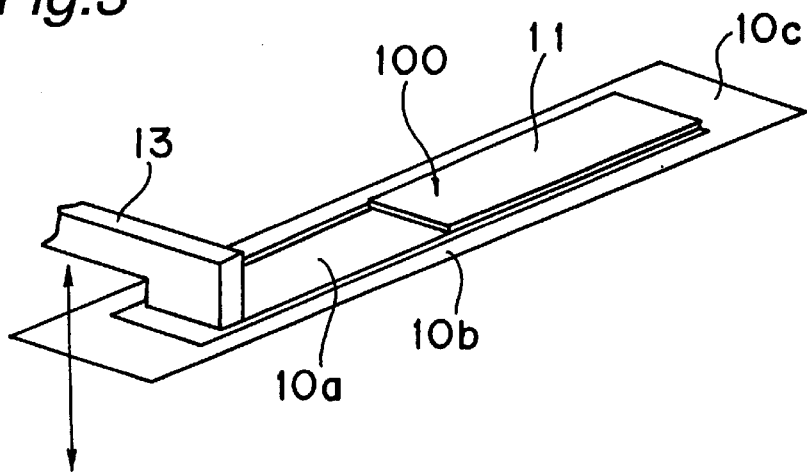
FIG. 3 is a perspective view of the piezoelectric actuator of FIG. 1 with the support member attached thereon.
Figure 3:
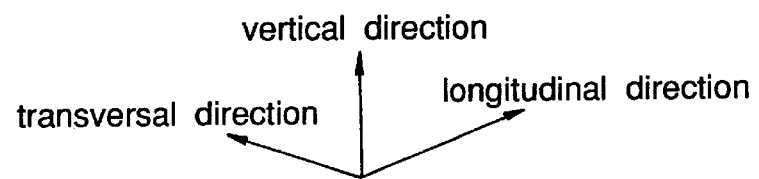

In case the oscillator constituted as described above is supported at an end (hereinafter called supporting end T1) of the thin elastic plate of the drive section 10a as shown in FIG. 3 and a drive voltage having a predetermined frequency (drive frequency) is applied to the piezoelectric diaphragm 11, the oscillator vibrates as described below.

The piezoelectric diaphragm 11 expands or contracts in the longitudinal direction thereof at a frequency equal to the drive frequency according to the drive voltage. This causes the drive section 100 to make flexural oscillation at the same frequency as the drive frequency. Since the drive section 100 is fixed at the support end T1, the connecting portion 10c vibrates vertically due to the flexural oscillation. The vertical vibration of the connecting portion 10c induces a vertical movement of the tip at the opposite end of the connection with the connecting portion 10c in the displacement amplifying section 10b. The drive section 100 and the displacement amplifying section 10b vibrate in synchronization and the flexural oscillation of the displacement amplifying section 10b is superposed onto the vertical vibration of the connecting portion 10c, vibration amplitude of the connecting portion 10c can be made greater.

In other words, with the configuration shown in FIG. 3 and the voltage of the predetermined frequency being applied, a vibration approximate to the primary vibration of a cantilever having an effective length equal to the sum of length of the drive section 100 and length of the displacement amplifying section 10b can be obtained. Consequently, in the first embodiment where output displacement is obtained on the tip at the opposite end of the connection with the connecting portion 10c in the displacement amplifying section 10b, a large displacement corresponding to the effective length of the primary vibration can be obtained.

In the first embodiment, since the displacement of the drive section 100 is amplified by the displacement amplifying section 10b, the piezoelectric actuator as a whole provides a large amount of displacement while making the piezoelectric oscillator 11 undergo only a small amount of displacement (expansion or contraction in longitudinal direction). In addition, the piezoelectric actuator can be made smaller in size. Also according to the first embodiment, the connecting portion 10c makes it possible to prevent a large strain caused by a large deformation, which occurs when the displacement amplifying section 10b makes resonance vibration, from being transmitted to the piezoelectric diaphragm 11 bonded onto the drive section 100. Consequently, strains which the piezoelectric diaphragm 11 undergoes can be limited to those of low magnitudes which are caused by the applied voltage, even when a great displacement is produced by the displacement amplifying section 10b, thus maintaining high reliability.

The effects described above can also be obtained when the drive section of bimorph type is used, similarly to the case of unimorph type drive section.

According to the first embodiment, output displacement is obtained on the tip at the opposite end of the connection with the connecting portion 10c in the displacement amplifying section 10b, although the present invention is not limited to this configuration and output displacement may also be obtained from the connecting portion 10c.

Figure 4:
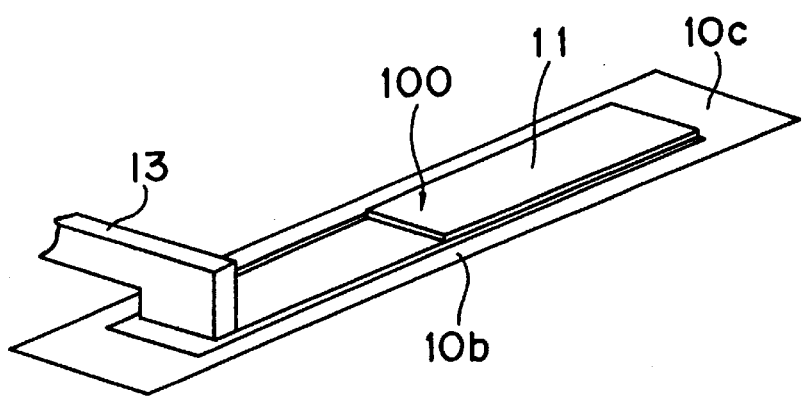
FIG. 4 is a perspective view showing the first variation of the first embodiment.
Figure 4:
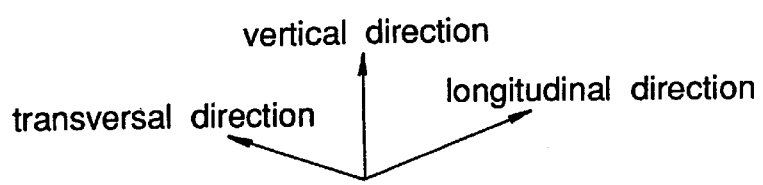
Figure 5:
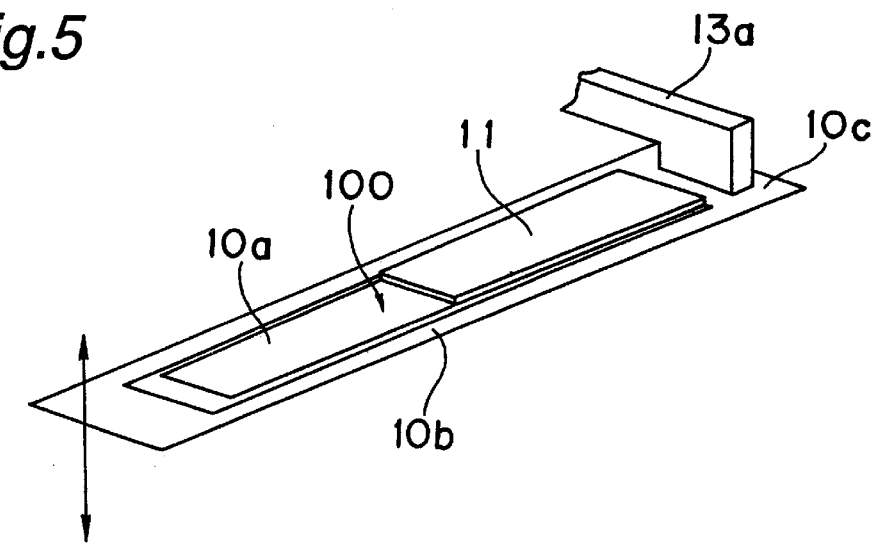
FIG. 5 is a perspective view showing the second variation of the first embodiment.
Figure 5:
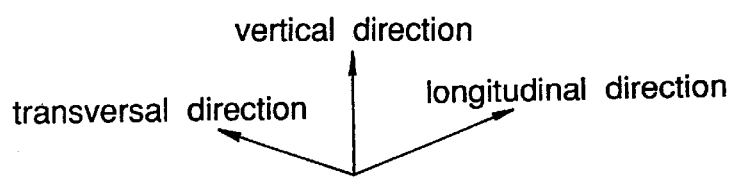

In case the piezoelectric actuator is made in such a configuration as shown in FIG. 4, flexural oscillation of the displacement amplifying section 10b gives an influence like bouncing vibration to the drive section 100, thus amplifying the vibration of the drive section 100 through the reaction of the displacement amplifying section 10b. As a result, amplitude of the vibration of the connecting portion 10c which is connected to the free end of the drive section 100 increases. Consequently, greater displacements can be obtained than in the case where the displacement amplifying section 10b is not provided, even when a large displacement is produced at the connecting portion 10c of the drive section 100.

In the piezoelectric actuator of the first embodiment, the drive section is supported on the tip at the opposite end of the connection with the connecting portion 10c of the thin elastic plate of the drive section 10a, although the present invention is not limited to this configuration and the drive section may also be supported by a support member 13 in the connecting portion 10c. In this case, output displacement is obtained at the tip opposite to the connecting portion 10c of the displacement amplifying section 10b.

When the piezoelectric actuator is made in such a configuration described above, too, greater displacements can be obtained than in the case where the displacement amplifying section 10b is not provided.

When the support member 13 is provided on the connecting portion 10c in this configuration, more efficient design is made possible because the shapes of the drive section 100 and the displacement amplifying section 10b do not have an influence on the resonance frequency of each other.

Embodiment 2

Figure 6:
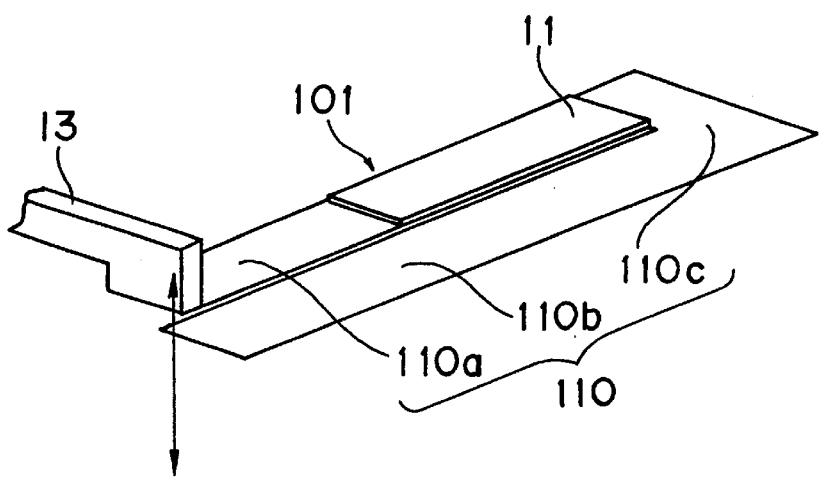
FIG. 6 is a perspective view showing the configuration of the piezoelectric actuator according to the second embodiment of the present invention.
Figure 6:
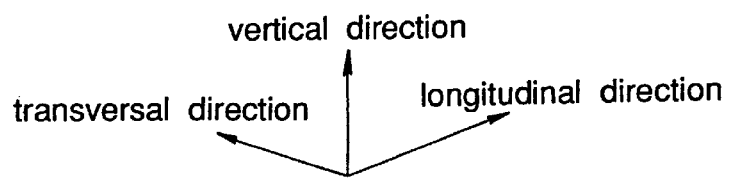

Second embodiment of the present invention will be described below with reference to the accompanying drawings. FIG. 6 is a perspective view showing a piezoelectric actuator according to the second embodiment of the present invention.

The piezoelectric actuator of the second embodiment comprises an elastic shim 110 made by connecting a thin elastic plate of the drive section 110a and a thin elastic plate 110b which are disposed in parallel to each other and are connected by a connecting portion: 110c, and a piezoelectric diaphragm 11 bonded onto the thin elastic plate of the drive section 110a, wherein the thin elastic plate 110a is supported by the support member 13 on the tip opposite to the connecting end with the connecting portion 110c. The piezoelectric diaphragm 11 of the second embodiment is made in a configuration similar to that of the first embodiment. With this configuration, the drive section 101 comprising the thin elastic plate of the drive section 110a and the piezoelectric diaphragm 11 is caused to vibrate in flexural oscillation which in turn vibrates flexural oscillation in the displacement amplifying section 110b, so that the output displacement is obtained at the tip opposite to the end where the connecting portion 110c of the displacement amplifying section 110b is mounted.

In the piezoelectric actuator of the second embodiment, since the displacement amplifying section 110b is provided on one side of the drive section 101, the displacement amplifying section 110b is subject also to torsional vibration thus making it possible to produce further greater displacement than in the case of the first embodiment.

Thus because the displacement amplifying section 110b is mounted on one side of the drive section 110, there occurs a displacement between the center of mass of the drive section 110 and the center of mass of the displacement amplifying section 110b. This makes the effective length of the displacement amplifying section 110b become longer, thus amplifying the displacement of the tip of the displacement amplifying section 110b.

Figure 7:
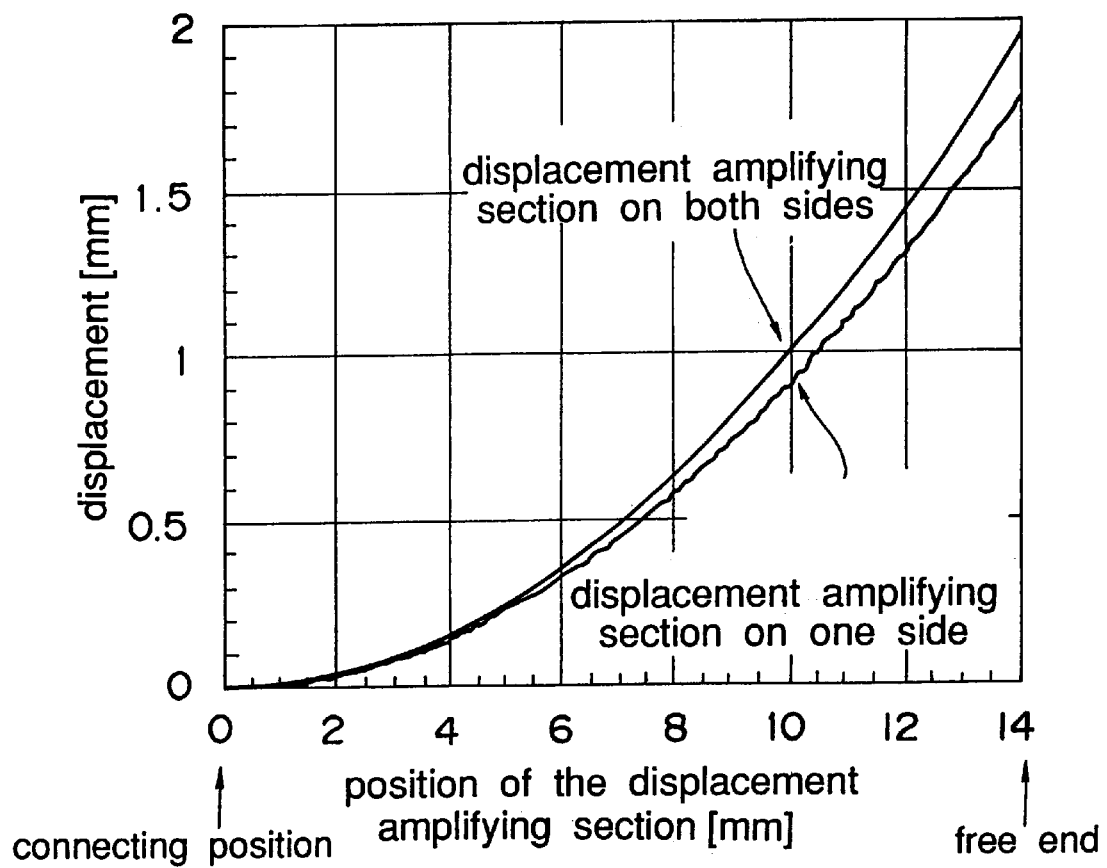
FIG. 7 is a graph showing the displacements in the first and the second embodiments.
Figure 8:
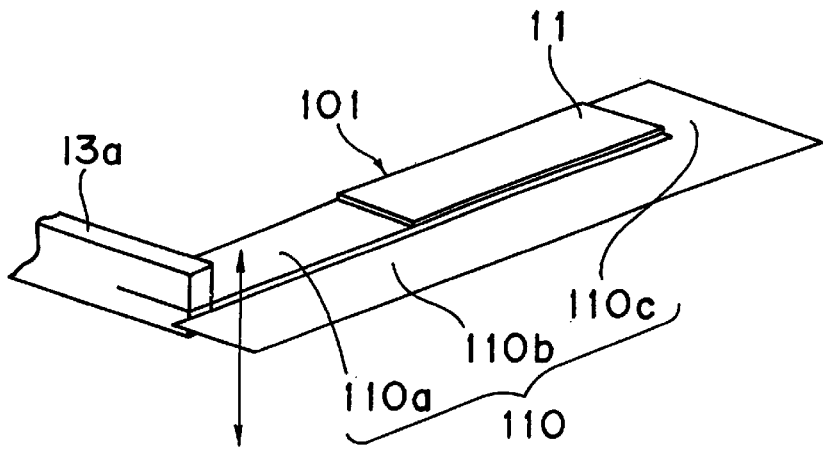
FIG. 8 is a perspective view showing the variation of the second embodiment.
Figure 8:
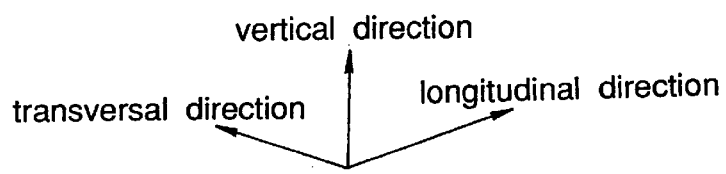

FIG. 7 shows the displacements in the case of disposing the displacement amplifying sections on both sides of the drive section as shown in the first embodiment, and in the case of disposing the displacement amplifying section on one side of the drive section as in the second embodiment. FIG. 7 is a graph that plots the displacement of the connecting portion versus the position relative to the connecting portion of the displacement amplifying section. It will be clear from FIG. 7 that greater displacement can be produced compared to the first embodiment where the displacement amplifying section 110b is disposed on one side of the drive section, in the case of the second embodiment where the displacement amplifying section is disposed on one side of the drive section.

According to the second embodiment, production cost can be reduced since the elastic shim 110 can be made in simpler shape.

According to the second embodiment, the support member 13 is fixed on the top surface of the thin elastic plate of the drive section 110a, but the present invention is not limited to this configuration and the support member 13 may have a notch at the tip into which the thin elastic plate 110a is held. This configuration makes it possible to fasten the piezoelectric actuator more reliably and causes easily assembly during the production.

Embodiment 3

A piezoelectric actuator according to third embodiment of the present invention will be described below with reference to the accompanying drawings.

Figure 9:
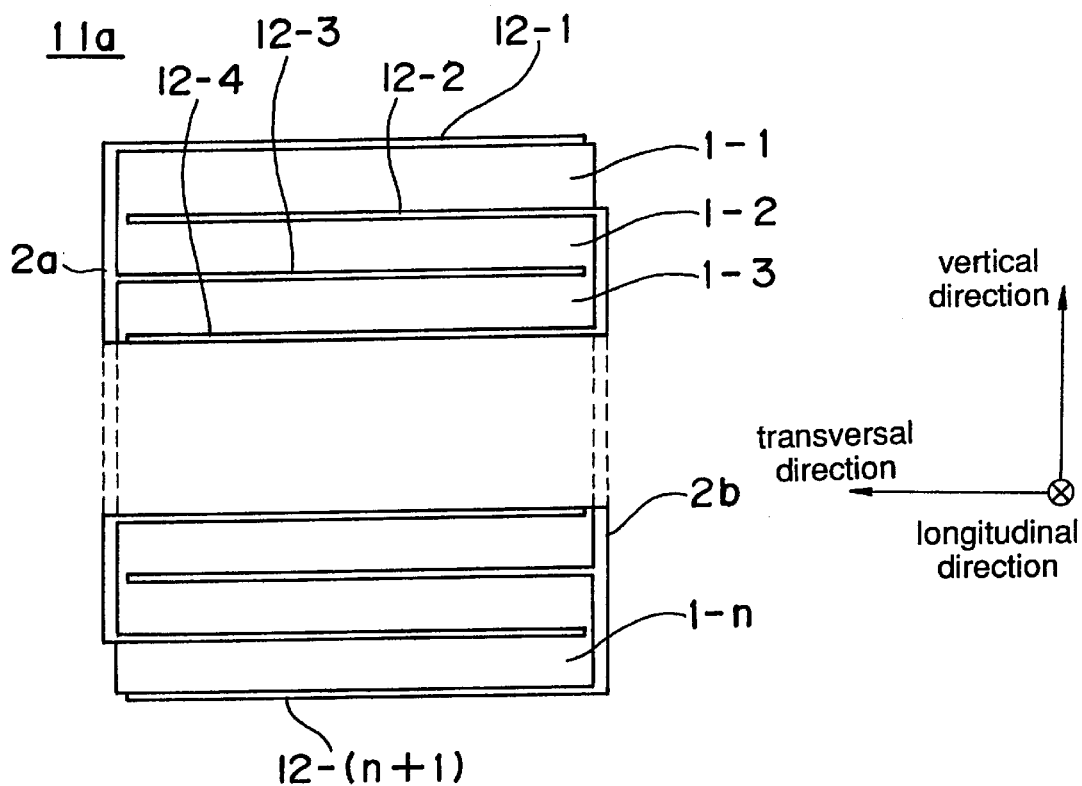
FIG. 9 is a cross sectional view schematically showing the piezoelectric diaphragm 11a of laminated construction used in the piezoelectric actuator of the third embodiment of the present invention.

The piezoelectric actuator of the third embodiment is similar to that of the first embodiment, except that the piezoelectric diaphragm 11 is replaced with a piezoelectric diaphragm 11a of laminated construction shown in FIG. 9.

The piezoelectric diaphragm 11a employed in the third embodiment is made by alternately laminating electrode layers 12-k (k=1, 2, 3, . . . , n−1) and piezoelectric ceramic layers 1-k (k=1, 2, 3, . . . , n) so that the electrode layers make the top and bottom layers as shown in FIG. 9. The electrodes 12-1, 12-3, . . . , 12-n are connected by a side electrode 2a and the electrodes 12-2, 12-4, . . . , 12-(n+1) are connected by a side electrode 2b. The piezoelectric ceramic layers 1-k are polarized in the direction of thickness in either polarity so that adjacent piezoelectric ceramic layers have opposite polarities.

In the piezoelectric actuator of the third embodiment made in the configuration described above, thickness of the piezoelectric ceramic layers 1-k can be decreased and the drive voltage can be applied to each of the piezoelectric ceramic layers through the side electrodes 2a, 2b, and therefore electric field of a high intensity can be generated in each of the piezoelectric ceramic layers because of the smaller thickness of the piezoelectric ceramic layers. In other words, because electric field of intensity equal to or higher than that generated in the piezoelectric ceramic layer 1 of the first embodiment can be generated in each of the piezoelectric ceramic layers 1-k with a drive voltage lower than that applied to the piezoelectric actuator of the first embodiment, a displacement equal to or greater than that of the first embodiment can be achieved with a lower drive voltage.

Assume that the number of the piezoelectric ceramic layers 1-k laminated in the piezoelectric diaphragm 11a of the third embodiment is n and the drive voltage V0 is applied in the first embodiment, then voltage Vneed required to achieve a displacement comparable to that of the first embodiment is as low as that given by equation 1. This calculation assumes that the piezoelectric diaphragm 11 and the piezoelectric diaphragm 11a have the same profile dimensions.

[Equation 1]

$$V_{need} = V_0/n$$

While a drive circuit for applying the drive voltage to the piezoelectric diaphragm 11, 11a typically uses a voltage step-up or step-down circuit, the third embodiment eliminates the voltage step-up or step-down circuit from the drive circuit because the intensity of the electric field generated in each of the piezoelectric ceramic layers can be controlled by adjusting the number of the piezoelectric diaphragm 11a to be laminated, thereby making the drive circuit simpler.

The effects described above can also be obtained when the drive section of bimorph type is used, similarly to the case of unimorph type drive section.

The piezoelectric diaphragm 11a of the third embodiment can also be applied to the second embodiment while achieving similar effects.

It is also a matter of course that similar effects can be achieved with the common unimorph type element as well as bimorph type element.

Embodiment 4

A piezoelectric actuator according to a fourth embodiment of the present invention will be described below with reference to the accompanying drawings.

Figure 31:
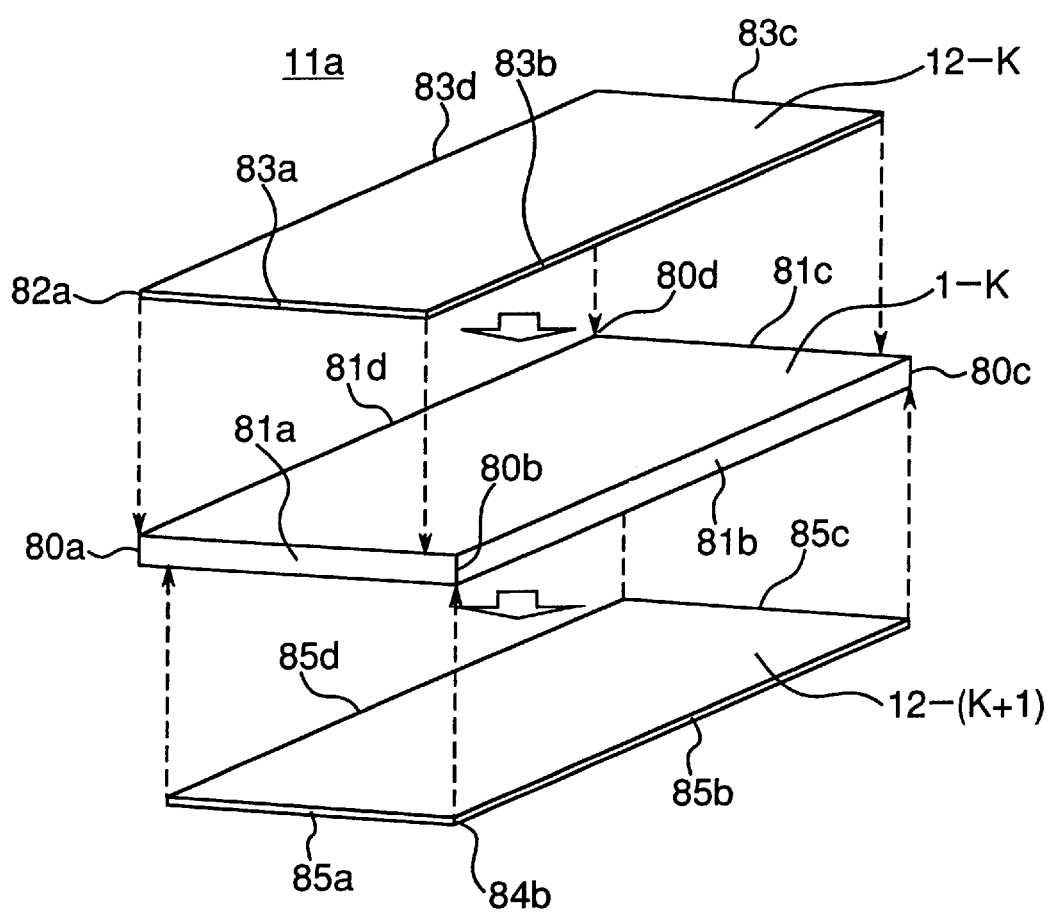
FIG. 31 is an exploded perspective view showing a part of the piezoelectric diaphragm according to the third embodiment of the present invention.
Figure 32:
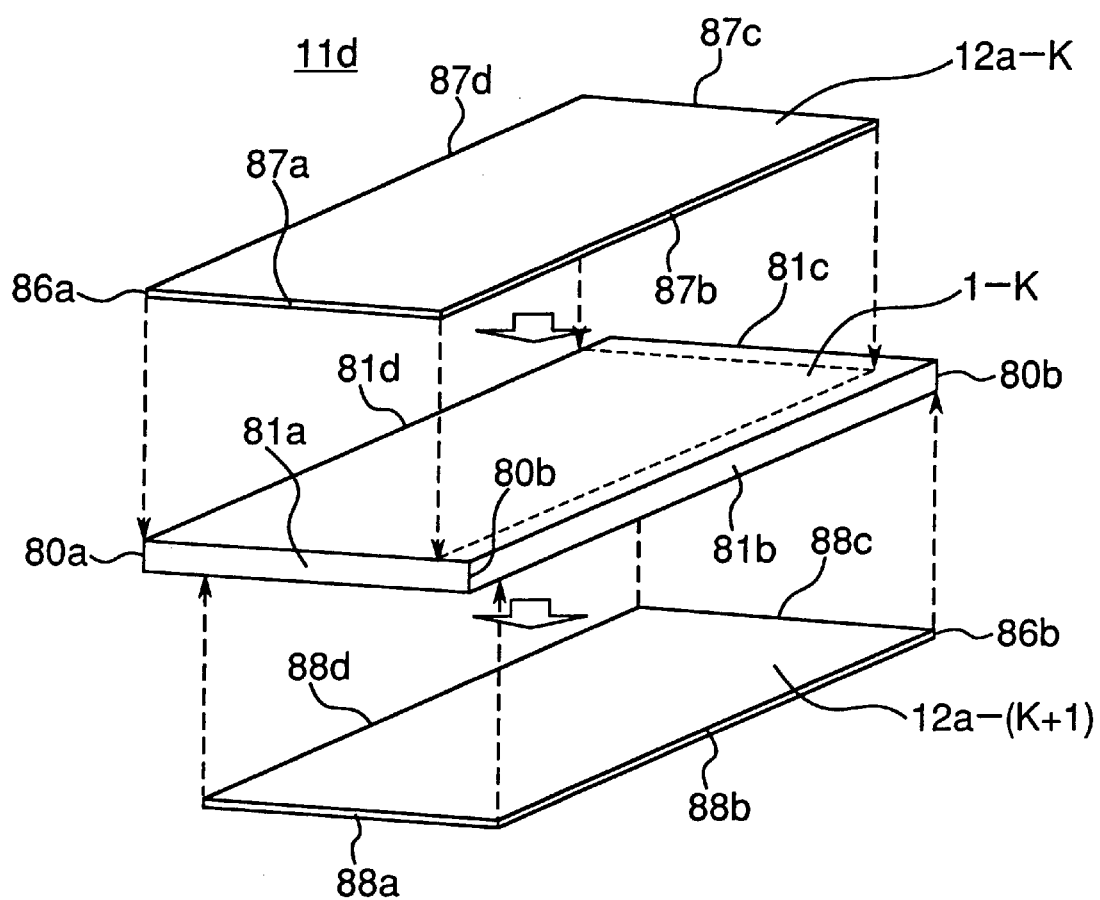
FIG. 32 is an exploded perspective view showing a part of the piezoelectric diaphragm according to the fourth embodiment of the present invention.

The piezoelectric actuator of the fourth embodiment is similar to that of the third embodiment, except for the shapes of the electrodes 12-k, 12-(k+1) formed at the top and bottom of the piezoelectric ceramic layers 1-k. FIG. 31 and FIG. 32 are exploded perspective views of a part of the piezoelectric diaphragms (electrodes formed at the top and bottom of the piezoelectric ceramic layers) in the third and the fourth embodiments, respectively.

In the piezoelectric diaphragm 11a of the third embodiment, the electrode layers 12-k (k=1, 2, 3, . . ., n+1) are made slightly smaller in width than the piezoelectric ceramic layers 1-k (k=1, 2, 3, . . ., n) as shown in FIG. 31. The electrode layer 12-k formed on one surface of the piezoelectric ceramic layers 1-k is formed so that an edge 83a, an edge 83c and a side face 83d thereof coincide with an edge 81a, an edge 81c and a side face 81d of the piezoelectric ceramic layer 1-k, respectively, and a side face 83b of the electrode layer 12-k is located slightly inward from a side face 81b of the piezoelectric ceramic layer 1-k. The electrode layer 12-(k−1) formed on the other surface of the piezoelectric ceramic layers 1-k is formed so that an edge 85a, an edge 85c and a side face 85b thereof coincide with the edge 81a, the edge 81c and the side face 81b of the piezoelectric ceramic layer 1-k, respectively, and a side face 85d of the electrode layer 12-(k−1) is located slightly inward from the side face 81d of the piezoelectric ceramic layer 1-k.

In the piezoelectric diaphragm lid of the fourth embodiment, in contrast, the electrode layers 12a-k (k=1, 2, 3, . . . , n+1) are made slightly smaller in width than the piezoelectric ceramic layers 1-k (k=1, 2, 3, . . . , n) as shown in FIG. 32, similarly to the third embodiment, but is different from the third embodiment as described below. The electrode layer 12a-k formed on one surface of the piezoelectric ceramic layers 1-k is formed so that an edge 87a and a side face 87d thereof coincide with the edge 81a, the edge 81c and the side face 81d of the piezoelectric ceramic layer 1-k, respectively, and a side face 87b of the electrode layer 12a-k is located slightly inward from the side face 81b of the piezoelectric ceramic layer 1-k, and an edge 87c of the electrode layer 12a-k is located slightly inward from the edge 81c of the piezoelectric ceramic layer 1-k. The electrode layer 12a-(k+1) formed on the other surface of the piezoelectric ceramic layer 1-k is formed so that an edge 88c and a side face 88b thereof coincide with the edge 81c and the side face 81b of the piezoelectric ceramic layer 1-k, respectively, and an edge 88a and a side face 88d of the electrode layer 12a-(k+1) are located slightly inward from the edge 81a and the side face 81d of the piezoelectric ceramic layer 1-k, respectively.

In the piezoelectric diaphragm 11d of the fourth embodiment, as described above, in addition to the electrode layers 12a-k (k=1, 2, 3, . . . , n+1) being made slightly smaller in length and width than the piezoelectric ceramic layer 1-k (k=1, 2, 3, . . . , n), the electrode layers are laminated to make the adjacent electrode layers are staggered from each other, so that a corner 80a of the piezoelectric ceramic layer 1-k coincides with a corner 86a of the electrode layer 12a-k and a corner 80b which diagonally oppose the corner 80a of the piezoelectric ceramic layer 1-k coincides with a corner 86b of the next electrode layer 12a-(k+1).

In the piezoelectric ceramic layer of the fourth embodiment made in the configuration described above, one edge and one side face have only the electrode layers of the same potential being exposed thereon, and therefore there occurs no trouble in the operation when the electrodes are short-circuited on the edge or the side face.

As a result, there occurs no deterioration in the reliability under adverse conditions such as high temperature and high humidity even when the electrodes are made of a material which is prone to migration of silver or the like. Thus silver or a silver-based metal which is relatively less expensive can be used for the electrodes.

While the piezoelectric diaphragm of a piezoelectric actuator is typically made by cutting an over-sized sintered plate into predetermined size, it is made possible in the piezoelectric diaphragm employed in the fourth embodiment to prevent short-circuiting of electrodes which should be at different potentials from taking place due to burrs that may be produced on the electrode layers during cut-off. When the piezoelectric diaphragm is cut for trimming the width, it is cut off between the side face 81b of the piezoelectric ceramic layer 1-k and the side face 87b of the electrode layer 12a-k, or between the side face 81d of the piezoelectric ceramic layer 1-k and the side face 88d of the electrode layer 12a-k. When the piezoelectric diaphragm is cut for trimming the length, it is cut off between the edge 81c of the piezoelectric ceramic layer 1-k and the edge 87c of the electrode layer 12a-k, or between the side face 81a of the piezoelectric ceramic layer 1-k and the side face 88a of the electrode layer 12a-(k+1).

In such a scheme as described above, only the electrodes which should be at the same potential are cut off, thus making it possible to prevent short-circuiting of electrodes which should be at different potentials from taking place even when burrs are made during cut-off.

Variation

Some variations of the fourth embodiment will be described below.

Figure 33:
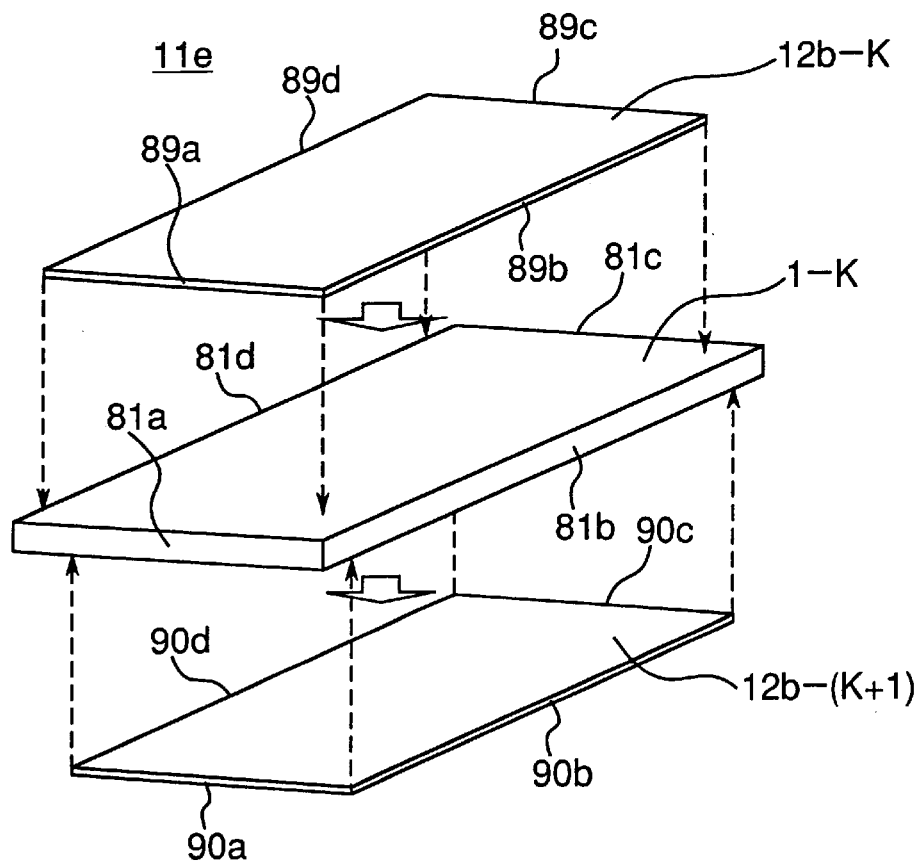
FIG. 33 is an exploded perspective view showing a part of the piezoelectric diaphragm of another configuration according to the fourth embodiment of the present invention.
Figure 34:
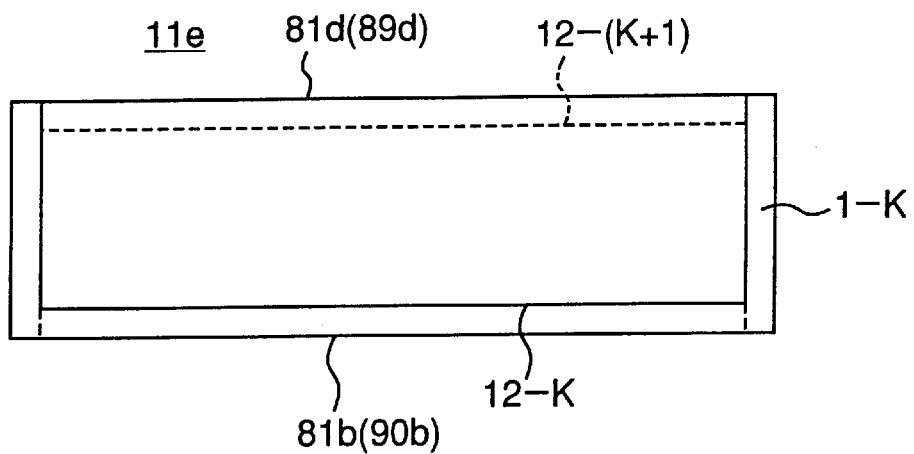
FIG. 34 shows the positional relationship of the electrodes of the piezoelectric diaphragm of another configuration according to the fourth embodiment of the present invention.

FIG. 33 is an exploded perspective view of first variation showing a part of the piezoelectric diaphragms having another construction to achieve the fourth embodiment. FIG. 34 is a plan view of the piezoelectric ceramic layer from above showing the positional relationship of the electrodes.

In the piezoelectric diaphragm 11e of the first variation, the electrode layers 12b-k (k=1, 2, 3, . . . , n+1) are made slightly smaller in width than the piezoelectric ceramic layers 1-k (k=1, 2, 3, . . . , n) as shown in FIG. 33, but the configuration is different from the fourth embodiment in other respects as described below.

The electrode layer 12b-k formed on one surface of the piezoelectric ceramic layers 1-k is formed so that edges 89a, 89c and a side face 89b thereof are located slightly inward from the edges 81a, 81c and the side face 81b of the piezoelectric ceramic layer 1-k, respectively, and a side face 89d of the electrode layer 12b-k coincides with the side face 81d of the piezoelectric ceramic layer 1-k.

The electrode layer 12b-(k+1) formed on the other surface of the piezoelectric ceramic layer 1-k is formed so that edges 90a, 90c and a side face 90d thereof are located slightly inward from the edges 81a, 81c and the side face 81d of the piezoelectric ceramic layer 1-k, respectively, and a side face 90b of the electrode layer 12b-(k+1) coincides with the side face 81b of the piezoelectric ceramic layer 1-k. The piezoelectric diaphragm of the first variation made in this configuration has effects similar to those of the fourth embodiment.

Figure 35:
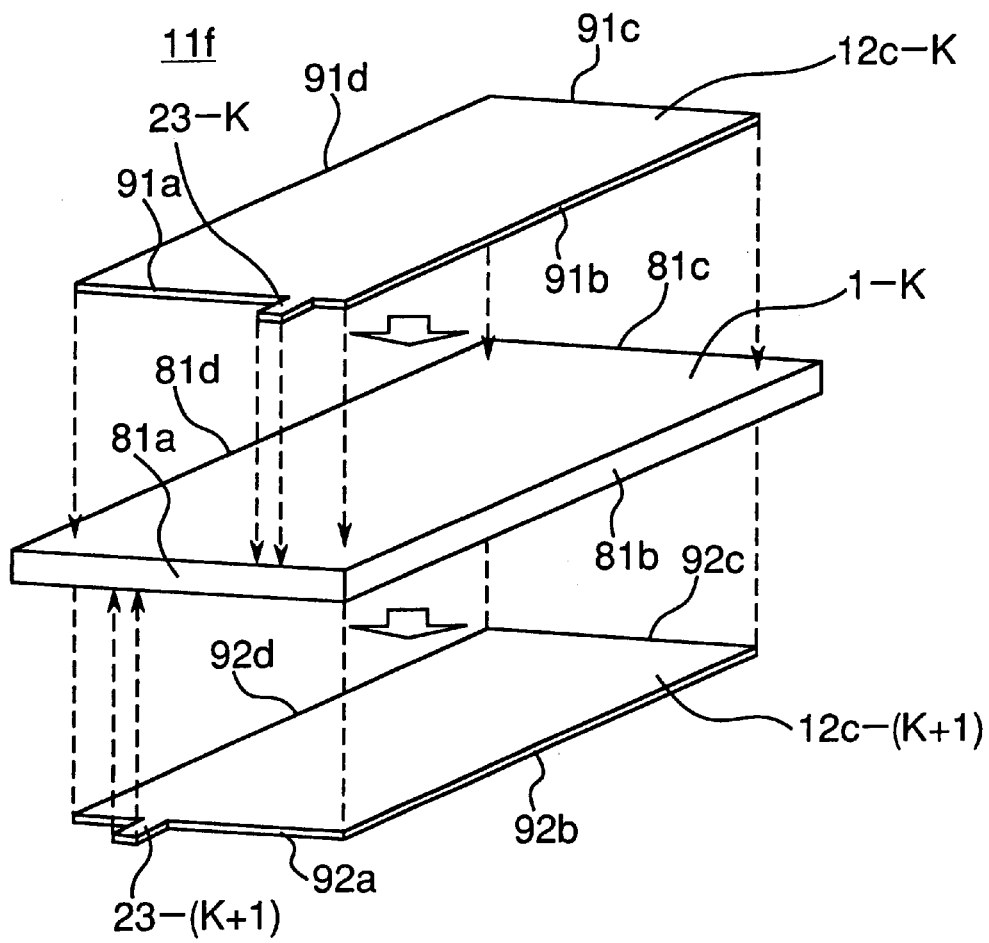
FIG. 35 is an exploded perspective view showing a part of the piezoelectric diaphragm of another configuration according to the fourth embodiment of the present invention.
Figure 36:
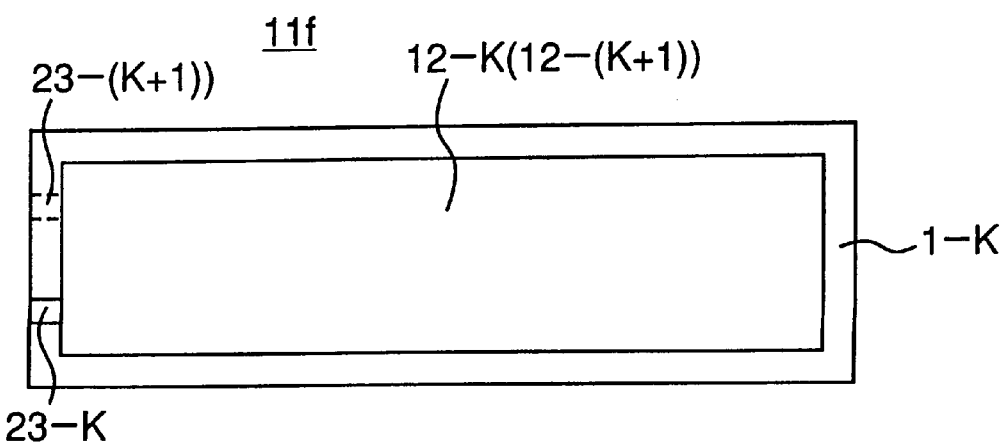
FIG. 36 shows the positional relationship of the electrodes of the piezoelectric diaphragm of another configuration according to the fourth embodiment of the present invention.

FIG. 35 is an exploded perspective view of second variation showing a part of the piezoelectric diaphragms having another construction to achieve the fourth embodiment. FIG. 36 is a plan view of the piezoelectric ceramic layer from above showing the positional relationship of the electrodes.

In the piezoelectric diaphragm 11f of the second variation, the electrode layers 12c-k (k=1, 2, 3, . . . , n+1) are made slightly smaller in width and length than the piezoelectric ceramic layers 1-k (k=1, 2, 3, . . . , n) as shown in FIG. 35, and are formed as described below.

The electrode layer 12c-k formed on one surface of the piezoelectric ceramic layers 1-k is formed so that edges 91a, 91c and side faces 91b, 91d thereof are located slightly inward from the edges 81a, 81c and the side faces 81b, 81d of the piezoelectric ceramic layer 1-k, respectively.

The electrode layer 12c–(k+1) formed on the other surface of the piezoelectric ceramic layer 1-k is formed so that edges 92a, 92c and side faces 92b, 92d thereof are located slightly inward from the edges 81a, 81c and the side faces 81b, 81d of the piezoelectric ceramic layer 1-k, respectively.

The electrode layer 12c-k has a protruding electrode 23–k formed near to the side face 91b of the edge 91a thereof, and the electrode layer 12c-(k+1) has a protruding electrode 23–(k+1) formed near to the side face 92d of the edge 92a thereof.

The piezoelectric diaphragm of the second variation has, as described above, the protruding electrodes (electrodes for the connection with external circuit) of every other electrode layers which are at the same potential disposed to oppose each other, so that the electrode layers of different potentials are located at different positions, as described above. The piezoelectric diaphragm of the second variation made in this configuration has effects similar to those of the fourth embodiment and also makes it possible to suppress the occurrence of chipping of the piezoelectric ceramic layer at a position near the border between the electrode layer and the piezoelectric ceramic layer, by cutting off the piezoelectric diaphragm between a side face of the electrode and a side face of the piezoelectric ceramic layer, and between an edge of the electrode and an edge of the piezoelectric ceramic layer.

When an electrode layer which is relatively soft and has high ductility and a very brittle piezoelectric ceramic layer are cut off at the same time, chipping tends to occur at an edge due to intercrystalline crack in the piezoelectric ceramic layer, however strictly the cutting conditions are controlled. This trouble becomes more likely to occur as the piezoelectric ceramic layer becomes thinner. In our experiments, it was difficult to cut off a piezoelectric ceramic layer thinner than 20 $\mu$m by the conventional process. In contrast, according to the second variation, the electrode layer and the piezoelectric ceramic layer are not cut off together except for the portion of the protruding electrode, and therefore chipping can be suppressed during cut-off.

Although the protruding electrodes having the same potential are formed at the same edge in the example described above, positions of two protruding electrodes are not limited to the same edge according to the present invention.

Figure 37A:
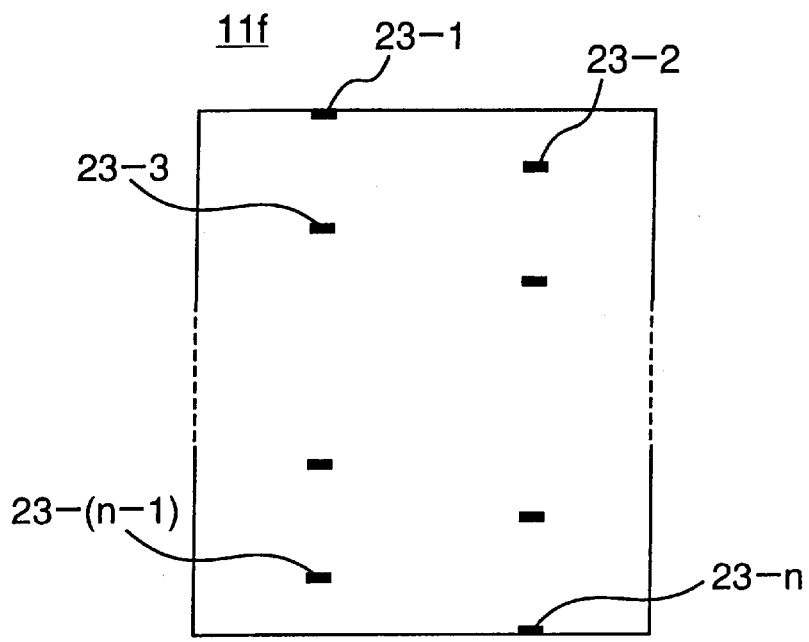
FIGS. 37A and 37B show an example of the connection electrodes of the piezoelectric diaphragm according to the fourth embodiment of the present invention.
Figure 37A:
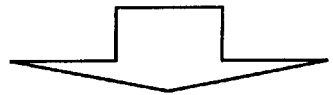
Figure 37B:
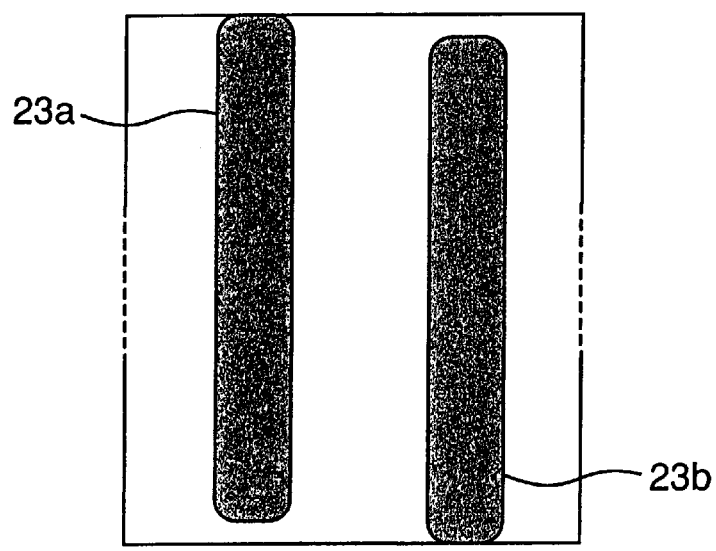

FIG. 37 shows an example of forming a connection electrode of the piezoelectric diaphragm 11f of the second variation. FIG. 37 (a) is a view before forming the connection electrode of the piezoelectric diaphragm 11f. In this example, as shown in FIG. 37 (b), a connection electrode 23a for connecting the protruding electrode 23-k(k=1, 3, . . . , n–1) and a connection electrode 23b for connecting the protruding electrode 23-k (k=2, 4, . . . , n) are formed at predetermined positions by forming metal films through vapor deposition or sputtering or by applying an electrically conductive paste. With this configuration, the piezoelectric diaphragm 11f can be vibrated by applying the drive voltage between the electrodes 12-1, 12-n formed on both principal surfaces, similarly to the case of the piezoelectric diaphragm 11 of the prior art.

The effects described above can also be obtained when the drive section of bimorph type is used, similarly to the case of unimorph type drive section.

Similar effects can also be achieved with the common unimorph type element as well as bimorph type element.
Embodiment 5

A piezoelectric actuator according a fifth embodiment of the present invention will be described below with reference to the accompanying drawings.

Figure 38:
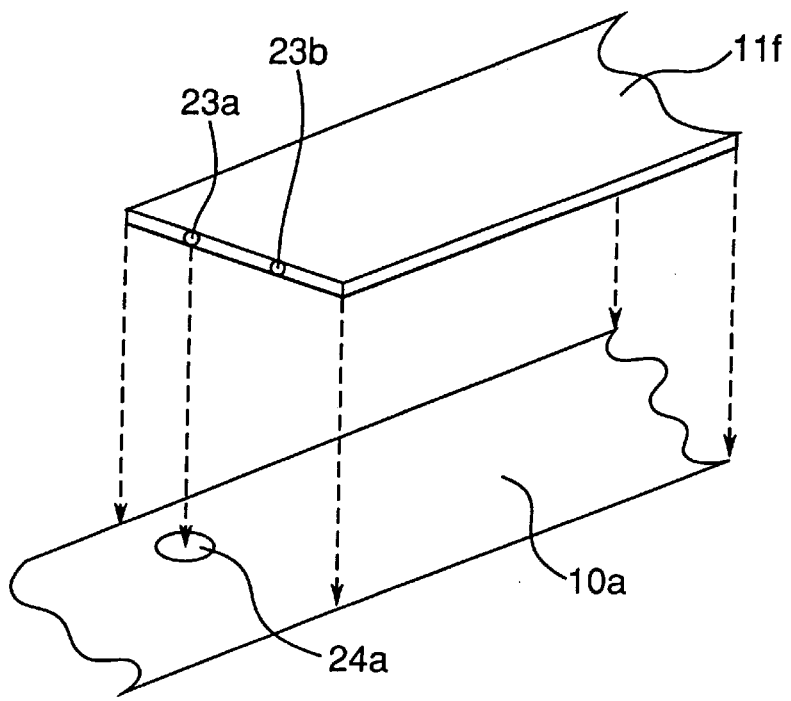
FIG. 38 is an exploded perspective view showing a part of the configuration of the piezoelectric actuator according to the fifth embodiment of the present invention.

The piezoelectric actuator of the fifth embodiment employs the piezoelectric diaphragm of the fourth embodiment. In the piezoelectric actuator of the fifth embodiment, a unimorph element in charge of vibration comprises the thin elastic plate of the drive section 10a and the piezoelectric diaphragm 11f which is bonded onto a part of the thin elastic plate of the drive section 10a, as shown in FIG. 38. Particularly in the fifth embodiment, a hole 24a larger than the connection electrode 23a is formed on the thin elastic plate of the drive section 10a so that the connection electrode 23a does not touch the thin elastic plate of the drive section 10a, thus making it possible to form the connection electrodes 23a, 23b by using an electrically conductive paste or the like after bonding the piezoelectric diaphragm 11f and the thin elastic plate of the drive section 10a together.

It is also made possible to prevent short-circuiting between the thin elastic plate of the drive section 10a which is electrically connected to the connection electrode 23b and the connection electrode 23a, and improve the stability against migration or other trouble during the production or operation under adverse conditions.

Some variations of the fifth embodiment will be described below.

Figure 39:
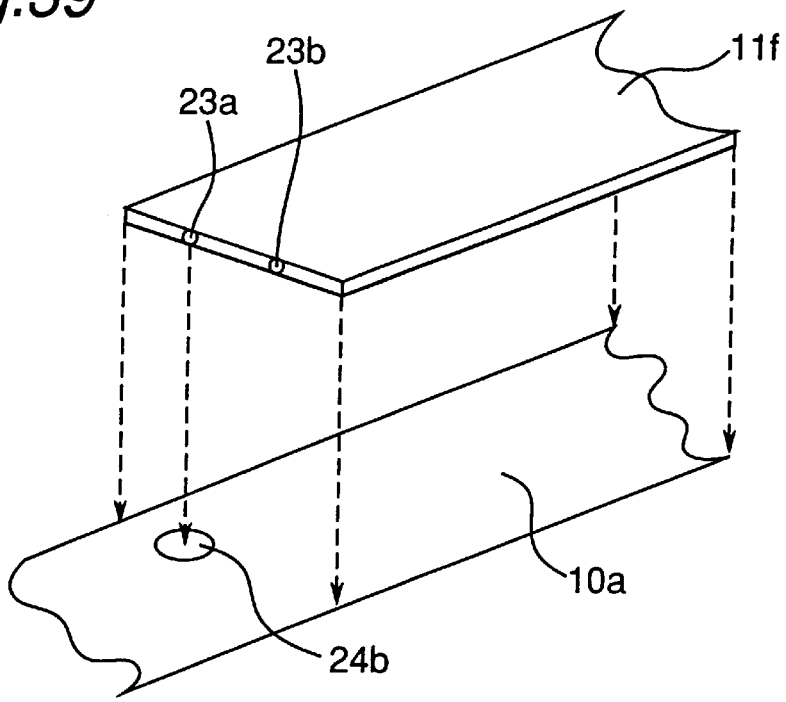
FIG. 39 is an exploded perspective view showing a part of the configuration of the piezoelectric actuator of another configuration according to the fifth embodiment of the present invention.

FIG. 39 is a partially exploded perspective view of the unimorph element used in a piezoelectric actuator of a variation of the fifth embodiment. This unimorph element is a variation of the unimorph element of the fifth embodiment shown in FIG. 38, wherein an insulator 24b, which prevents the thin elastic plate of the drive section 10a and the connection electrode 23a from making contact with each other, is formed instead of the hole 24a while the rest is similar to the fifth embodiment. This configuration also has effects similar to those of the fifth embodiment.

Figure 40:
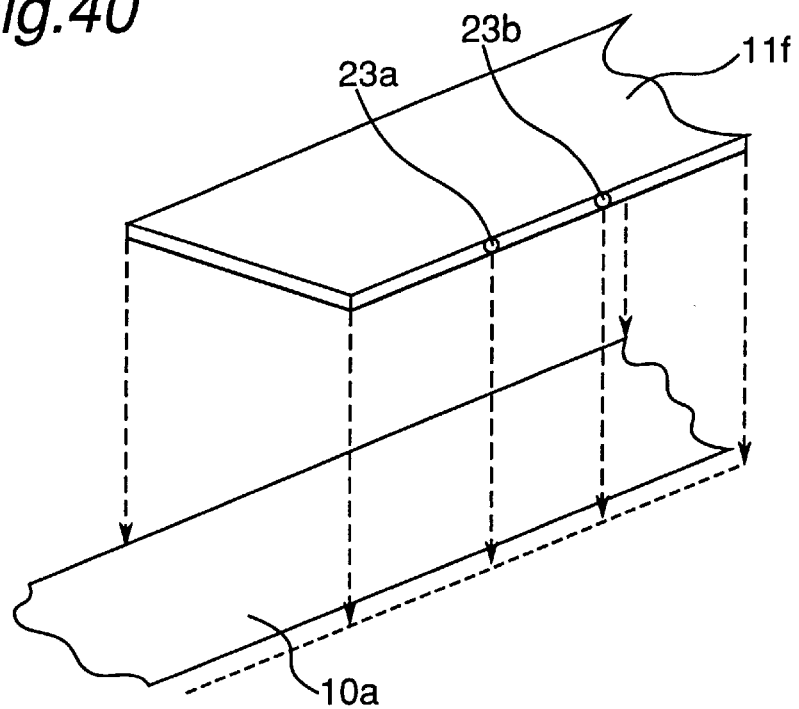
FIG. 40 is an exploded perspective view showing a part of the configuration of the piezoelectric actuator of another configuration according to the fifth embodiment of the present invention.
Figure 41:
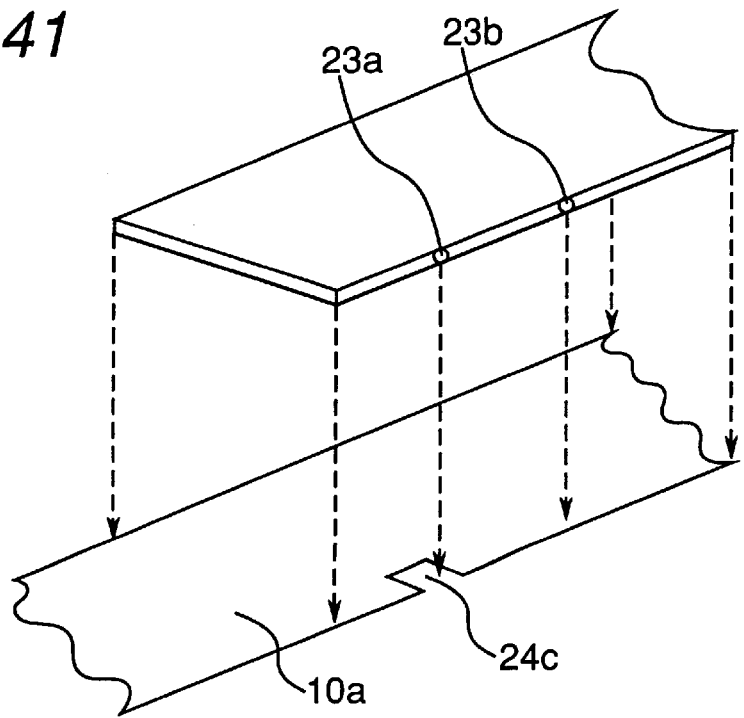
FIG. 41 is an exploded perspective view showing a part of the configuration of the piezoelectric actuator of another configuration according to the fifth embodiment of the present invention.

FIGS. 40 and 41 show other variations of the fifth embodiment, which is effective when at least one of the connection electrodes 23a, 23b is located on the side face of the piezoelectric diaphragm.

FIG. 40 shows an example of the unimorph element in charge of vibration which comprises the thin elastic plate of the drive section 10a having width slightly less than that of the piezoelectric diaphragm 11f and the piezoelectric diaphragm 11f which is bonded onto a part of the thin elastic plate of the drive section 10a. The piezoelectric diaphragm 11f is wider than the thin elastic plate of the drive section 10a and has a side face, whereon the connection electrodes 23a, 23b are formed, which is bonded to protrude beyond a side face of the thin elastic plate of the drive section 10a. This configuration makes it possible to easily form the connection electrodes 23a, 23b by using an electrically conductive paste or the like without causing short-circuiting between the connection electrode 23a and the thin elastic plate of the drive section 10a, after bonding the piezoelectric diaphragm 11f and the thin elastic plate of the drive section 10a together.

Further, it is made possible to improve the stability against migration during the production or operation under adverse conditions by keeping the distance between the thin elastic plate of the drive section 10a and the connection electrodes 23a not less than a predetermined minimum value.

FIG. 41 shows further another variation wherein a notch 24c larger than the connection electrode 23a is formed at a position where the connection electrode 23a would otherwise be located when bonding the piezoelectric diaphragm 11f and the thin elastic plate of the drive section 10a. This configuration also has the effects similar to those of the fifth embodiment.

Embodiment 6

A piezoelectric actuator according to a sixth embodiment of the present invention will be described below with reference to the accompanying drawings.

Figure 42:
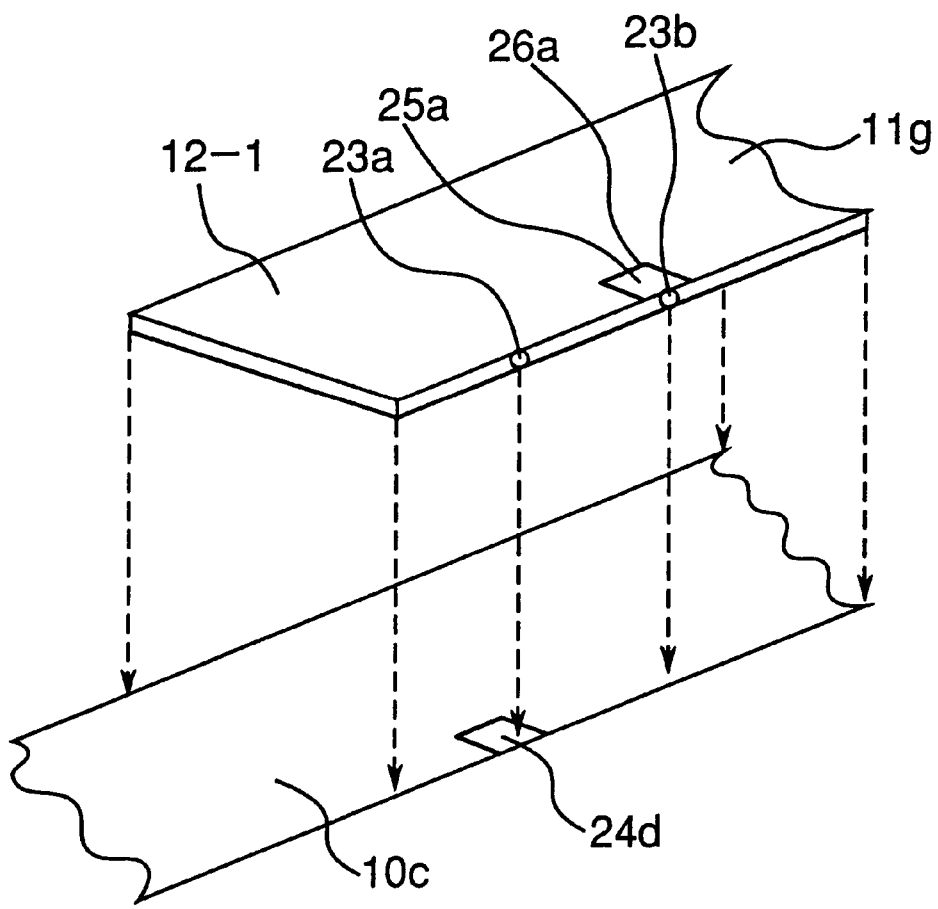
FIG. 42 is an exploded perspective view showing a part of the configuration of the piezoelectric actuator of another configuration according to the sixth embodiment of the present invention.

FIG. 42 is a partially exploded perspective view showing the construction of the unimorph element used in a piezoelectric actuator of the sixth embodiment.

In the piezoelectric actuator of the sixth embodiment, the unimorph element in charge of vibration comprises a thin elastic plate of the drive section 10c and a piezoelectric diaphragm 11g which is bonded onto a part of the thin elastic plate of the drive section 10c, as shown in FIG. 42.

In the sixth embodiment, an insulator 24d larger than the connection electrode 23a is formed in the thin elastic plate of the drive section 10a at a position where the connection electrode 23a would otherwise be located, and a lead-out electrode 25a which has continuity with the connection electrode 23b and is isolated from the electrode layer 12-1 is formed on the top surface of the piezoelectric diaphragm 11g. The lead-out electrode 25a is isolated by an insulation region 26a from the surface electrode 12-1. This configuration makes it possible to drive the piezoelectric actuator of the sixth embodiment by applying a drive voltage between the surface electrode 12-1 and the lead-out electrode 25a.

In the unimorph element P of the sixth embodiment made in the configuration described above, connection between the connection electrode 23b and the lead-out electrode 25a and connection between the connection electrode 23a and the surface electrode 12-1 are both made by direct connection of metal, which provide more reliable connection than the cases of the elements of the first through the fifth embodiments where the surface electrode on one side of the piezoelectric diaphragm and the thin elastic plate of the drive section are connected interposing a connection layer therebetween. Thus it is made possible to provide the piezoelectric actuator having high reliability during operation under adverse conditions such as high temperature and high humidity.

Figure 43A:
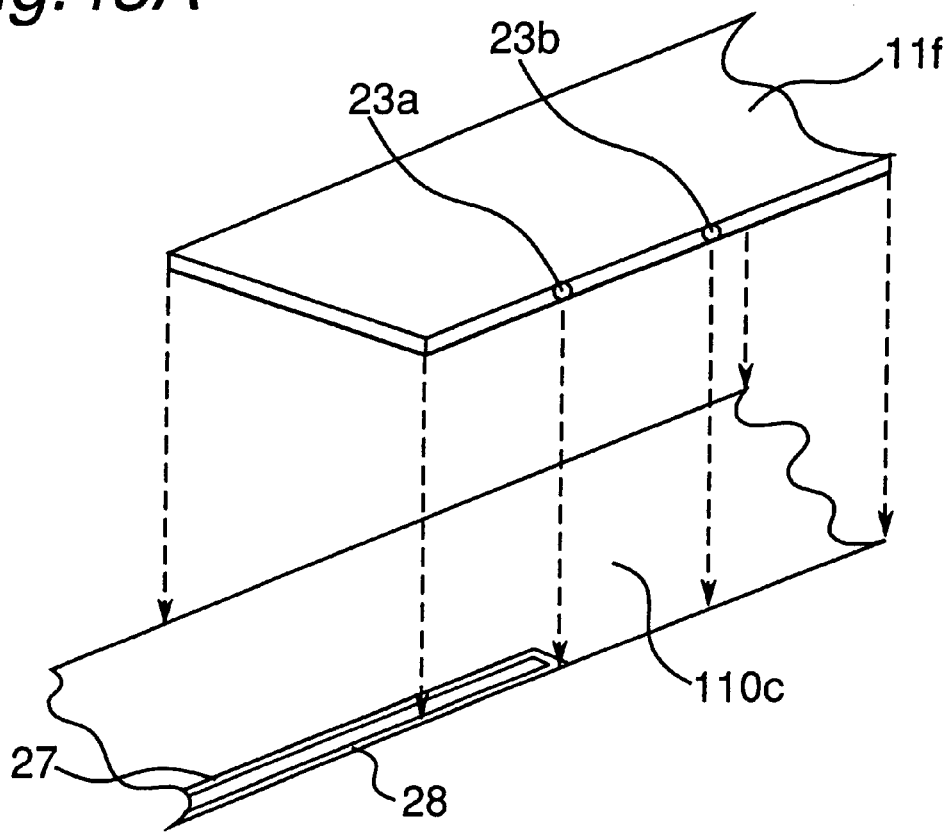
FIG. 43A is an exploded perspective view showing a part of the configuration of the piezoelectric actuator of another configuration according to the sixth embodiment of the present invention.
Figure 43B:
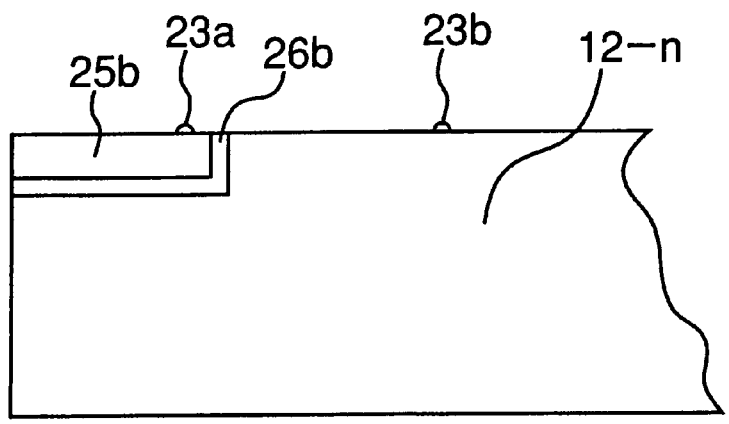
FIG. 43B is a plan view of a surface of a piezoelectric diaphragm 11h which opposes a thin elastic plate of the drive section 110c.

FIG. 43 (a) is a partially exploded perspective view showing the configuration of a unimorph element of a piezoelectric actuator in a variation of the sixth embodiment. FIG. 43 (b) is a plan view of a surface of a piezoelectric diaphragm 11h which opposes a thin elastic plate of the drive section 110c.

In this variation, the unimorph element in charge of vibration comprises the thin elastic plate of drive section 110c and the piezoelectric diaphragm 11h which is bonded onto a part of the thin elastic plate of drive section 110c, as shown in FIG. 43 (a).

In this configuration, a lead-out electrode 25b which is electrically isolated from an electrode 12-n is formed on the electrode 12-n of the piezoelectric diaphragm 11h via the insulation region 26b, and the connection electrode 23a is connected to the lead-out electrode 25b, as shown in FIG. 43 (b). On the other hand, the thin elastic plate of drive section 110c has a conductive layer 27 formed thereon via the insulation layer 28, while the piezoelectric diaphragm 11f and the thin elastic plate of drive section 110a are bonded to each other so that the electrode 25b opposes a part of the conductive layer 27.

As the piezoelectric diaphragm 11h and the thin elastic plate of drive section 110a are bonded to each other, electrical continuity is established between the lead-out electrode 25b and the conductive layer 27 and between the surface electrode 12-n and the thin elastic plate of drive section 110a. Consequently, the piezoelectric actuator of the sixth embodiment can be driven by applying a drive voltage between the thin elastic plate of drive section 110a and the conductive layer 27.

Figure 44:
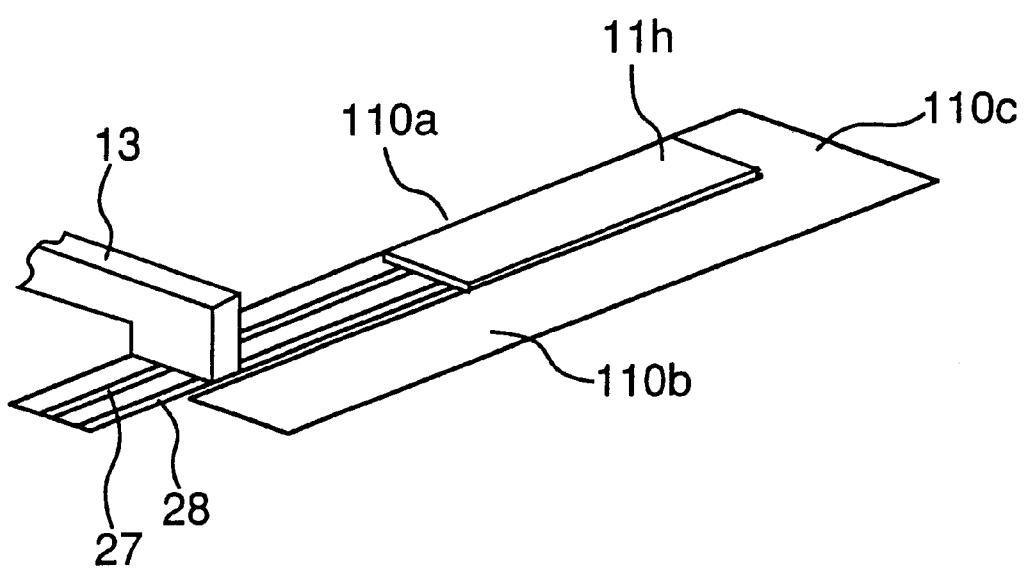
FIG. 44 is an exploded perspective view showing a part of the configuration of the piezoelectric actuator of another configuration according to the sixth embodiment of the present invention.

FIG. 44 shows a configuration where the insulation layer 28 and the conductive layer 27 are extended on the thin elastic plate of drive section 110a to the edge, and a voltage is applied between the thin elastic plate of drive section 110a and the conductive layer 27 at the edge thereof by means of a connector or the like, thereby driving the piezoelectric actuator.

This makes it possible to prevent adverse effect (mass adding effect) of solder or the like from affecting the resonance characteristic unlike a construction where solder is used in connection, and provide the piezoelectric actuator having less variation in the characteristics.

In a configuration where a drive voltage is applied between the surface electrode of the piezoelectric diaphragm and the displacement amplifying section by means of a wire or the like running from the surface of the piezoelectric diaphragm, there is a problem that the production cost cannot be decreased because of the wire connecting step which increases the production cost.

However, the configuration shown in FIG. 44 solves this problem and makes it unnecessary to lead out the wire, thus reducing the production cost.

The sixth embodiment has the effects similar to those of the other embodiments.

Embodiment 7

A piezoelectric actuator according to seventh embodiment of the present invention will be described below with reference to the accompanying drawings.

The piezoelectric actuator according to seventh embodiment is similar to that of the third embodiment except for a piezoelectric diaphragm 11i of laminated construction shown in FIG. 45 (a) instead of the piezoelectric diaphragm 11a of the third embodiment.

Figure 45A:
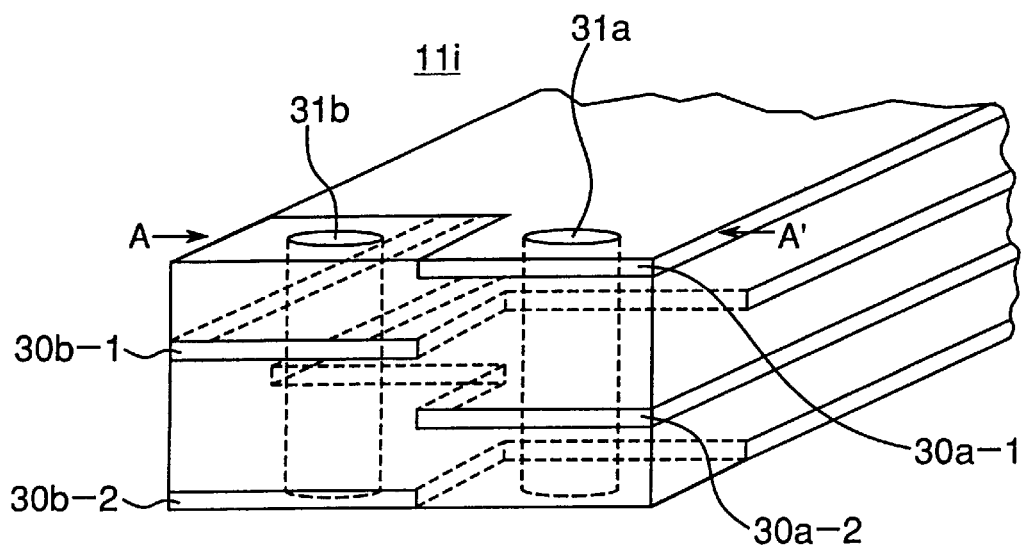
FIG. 45A is a perspective view showing the configuration of the piezoelectric diaphragm used in the piezoelectric actuator of the seventh embodiment of the present invention.
Figure 45B:
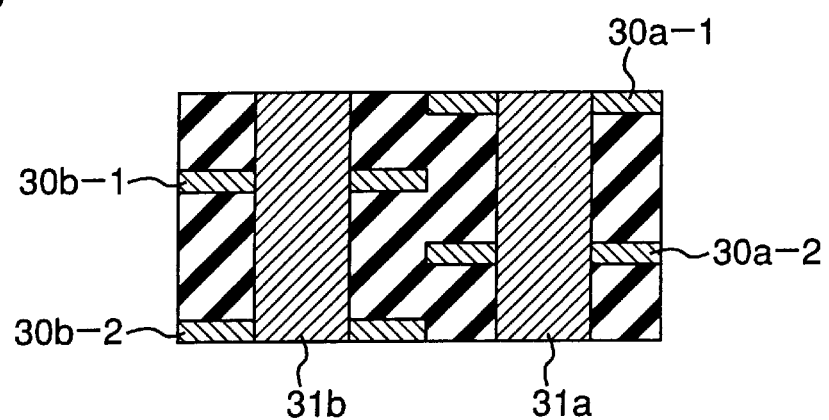
FIG. 45B is a cross sectional view along line A–A' of FIG. 45A.
Figure 46:
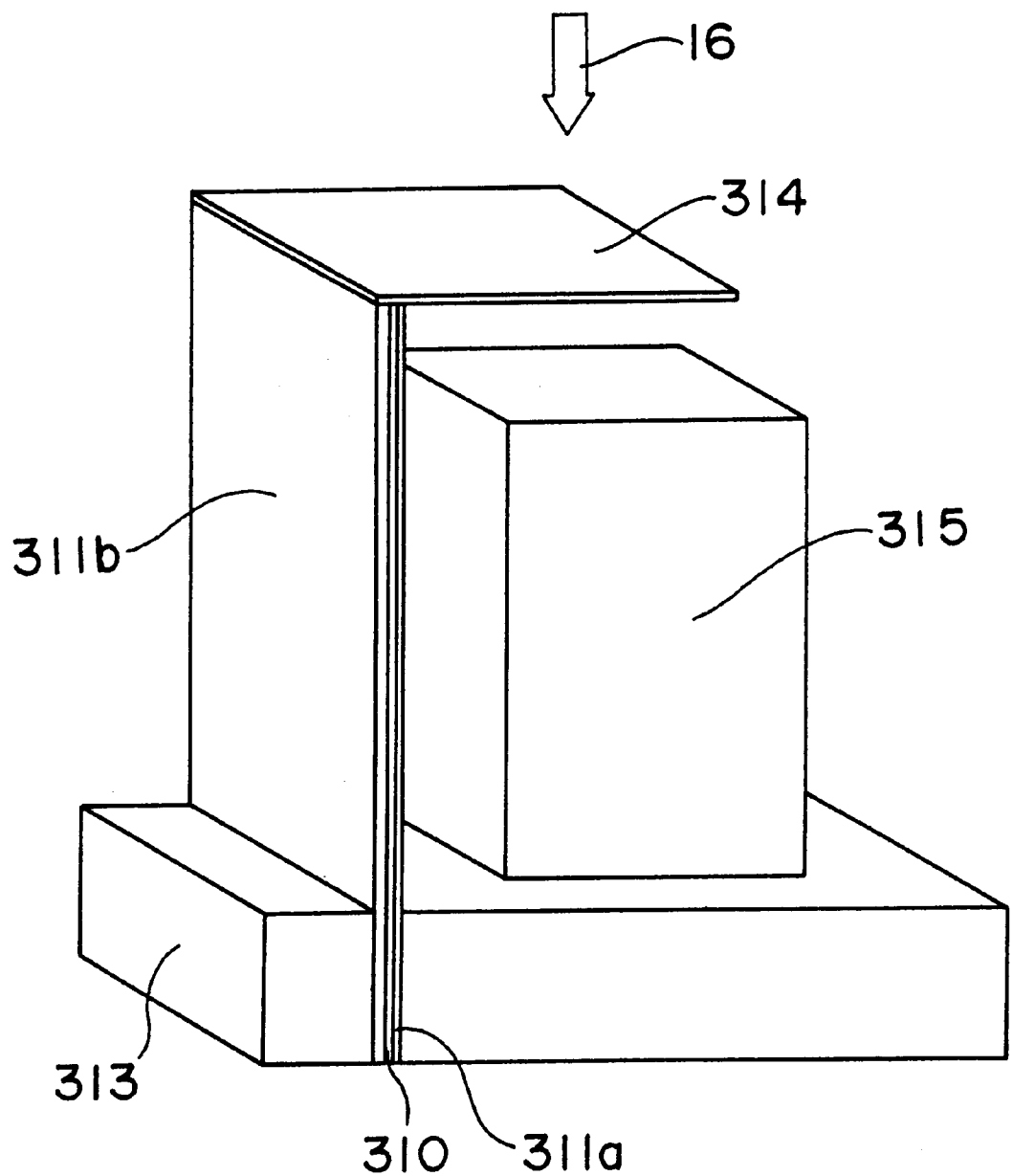
FIG. 46 is a perspective view schematically showing the configuration of the infrared sensor of the prior art.

Specifically, the piezoelectric diaphragm 11i comprises an electrode layer 30a-1, a piezoelectric ceramic layer, an electrode layer 30b-1, a piezoelectric ceramic layer, an electrode layer 30a-2, a piezoelectric ceramic layer and an electrode layer 30b-2 laminated successively. As shown in FIGS. 45 (a), (b), the electrode layer 30a-1 and the electrode layer 30a-2 are connected by a through hole 31a filled with an electrically conductive material such as electrically conductive resin at one end of the piezoelectric diaphragm 11i, while the electrode layer 30b-1 and the electrode layer 30b-2 are connected by a through hole 31b filled with an electrically conductive material such as electrically conductive resin at one end of the piezoelectric diaphragm 11i. FIG. 45(b) is a cross sectional view along line A–A' of FIG. 45(a).

Each of the piezoelectric ceramic layers is polarized in the direction of thickness in either polarity so that adjacent piezoelectric ceramic layers have opposite polarities depending on the polarity of the voltage applied to the piezoelectric ceramic layer.

The piezoelectric actuator of the seventh embodiment made in the configuration described above has effects similar to those of the third embodiment, and is capable of connecting between the electrodes easily and reliably.

In the piezoelectric actuator of the seventh embodiment, the through hole may also be filled with the same material as the electrode before sintering.

Embodiment 8

A piezoelectric actuator according to eighth embodiment of the present invention will be described below with reference to the accompanying drawings.

Figure 10:
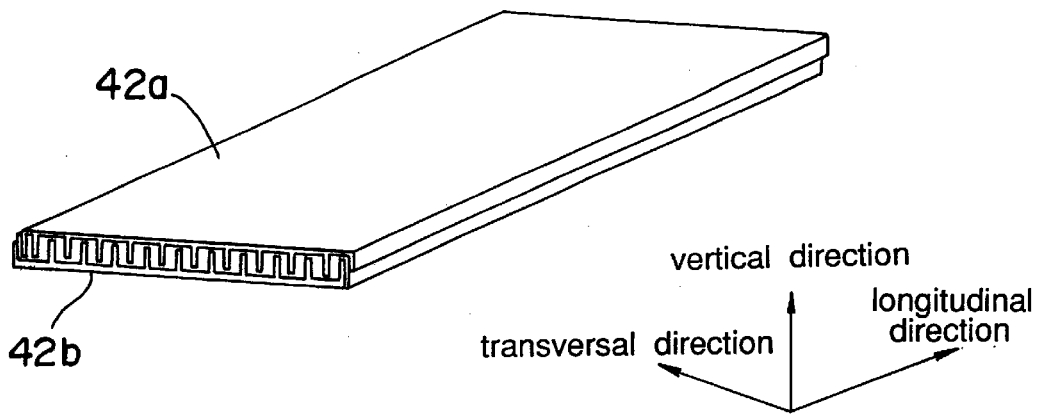
FIG. 10 is a perspective view schematically showing the piezoelectric diaphragm 11b of laminated construction used in the piezoelectric actuator of the eighth embodiment of the present invention.

The piezoelectric actuator according to eighth embodiment is similar to that of the first embodiment except for a piezoelectric diaphragm 11b of laminated construction shown in FIG. 10 being used instead of the piezoelectric diaphragm 11 of the first embodiment.

Figure 11:
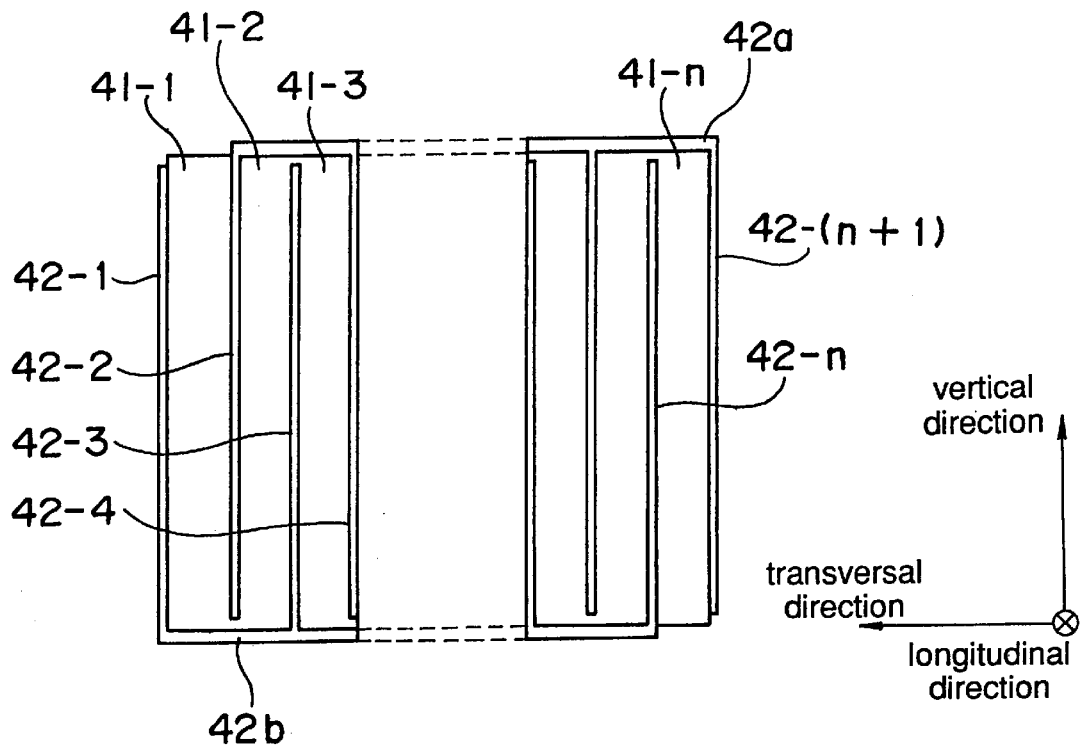
FIG. 11 is a cross sectional view schematically showing a cross section of the piezoelectric diaphragm 11b of FIG. 10.

The piezoelectric diaphragm 11b employed in the eighth embodiment is made by alternately laminating electrode layers 42-k (k=1, 2, 3, . . . , n+1) and piezoelectric ceramic layers 41-k (k=1, 2, 3, . . . , n) in the direction of width so that the electrode layers make the top and bottom layers as shown in FIG. 11. The electrodes 42-1, 42-3, . . . , 42-n are connected by an electrode 42b formed on one of the principal surfaces, and the electrodes 42-2, 42-4, . . . , 42-(n+1) are connected by an electrode 42a formed on the other principal surface. The piezoelectric ceramic layers are polarized in a direction determined by taking the directions of all applied voltages into consideration. Specifically, each of the piezoelectric ceramic layers is polarized in the direction of thickness so that adjacent piezoelectric ceramic layers have opposite polarities depending on the polarity of the voltage applied to the piezoelectric ceramic layer.

In the piezoelectric actuator of the eighth embodiment made in the configuration described above, thickness of the piezoelectric ceramic layers is decreased and the same drive voltage is applied to each of the piezoelectric ceramic layers through the side electrodes 2a, 2b, so that electric field of a high intensity can be generated in each of the piezoelectric ceramic layers because of the smaller thickness of the piezoelectric ceramic layers. With this configuration, because electric field of intensity equal to or higher than that generated in the piezoelectric ceramic layer 1 of the first embodiment can be generated in each of the piezoelectric ceramic layers 1-k with a drive voltage lower than that applied to the piezoelectric actuator of the first embodiment, a displacement equal to or greater than that of the first embodiment can be achieved with a lower drive voltage.

Assume that the number of the piezoelectric ceramic layers 41-k laminated in the piezoelectric diaphragm 11b of the eighth embodiment is n and the drive voltage V0 is applied in the first embodiment, then voltage Vneed 1 required to achieve a displacement comparable to that of the first embodiment is as low as that given by equation 2. This calculation assumes that the piezoelectric diaphragm 11 and the piezoelectric diaphragm 11a have the same profile dimensions.

[Equation 2]

$$V_{need\ 1} = V_0 \{ w / / (n\ t_0) \}$$

Equation 2 shows that, in case the thickness (w/n) of the piezoelectric ceramic layers 41-k is thinner than the thickness to of the piezoelectric diaphragms 11, 11b, the drive voltage can be made lower than that of the first embodiment. That is, the configuration described above has the effects similar to those of the first embodiment.

According to the eighth embodiment, by setting the small number of laminated layers n and setting the thickness (w/n) of the piezoelectric ceramic layers 41-k greater than the thickness of the piezoelectric diaphragms 11, 11b, it is made possible to decrease the intensity of the electric field generated in the piezoelectric ceramic layers 41-k thereby to achieve the effects achieved by decreasing the voltage with a step-down circuit. That is, in the third embodiment, the step-down circuit can be eliminated from the drive circuit by setting an appropriate value to the number of laminated layers n.

Embodiment 9

A piezoelectric actuator according to ninth embodiment of the present invention will be described below with reference to the accompanying drawings.

Figure 12:
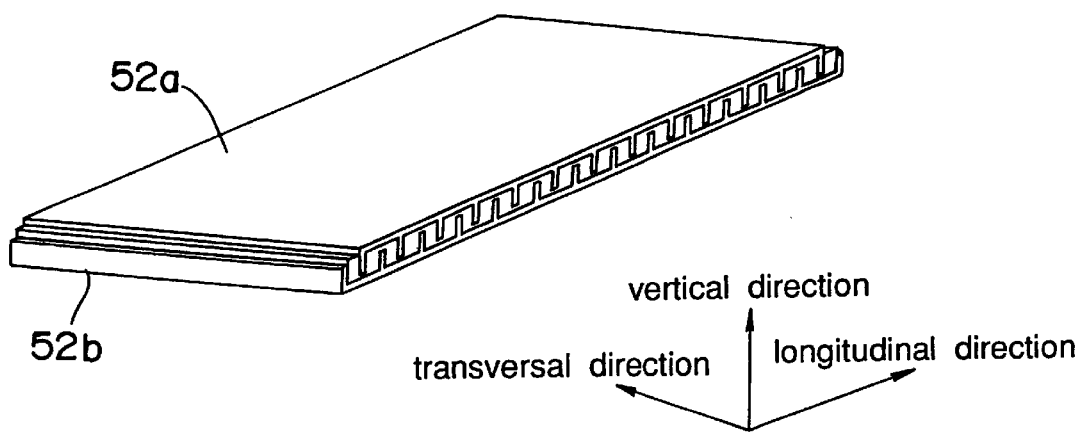
FIG. 12 is a perspective view showing the piezoelectric diaphragm 11c used in the piezoelectric actuator of the ninth embodiment of the present invention.

The piezoelectric actuator according to ninth embodiment is similar to that of the first embodiment except for a piezoelectric diaphragm 11c of laminated construction shown in FIG. 12 being used instead of the piezoelectric diaphragm 11 of the first embodiment.

Figure 13:
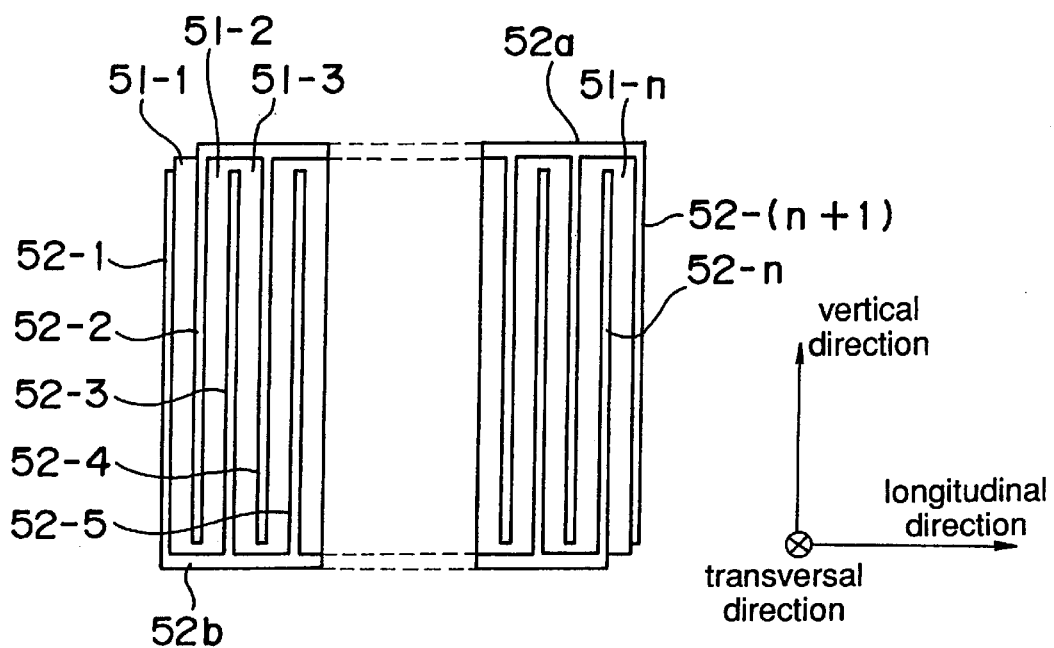
FIG. 13 is a cross sectional view schematically showing the piezoelectric diaphragm 11c of FIG. 12.

The piezoelectric diaphragm 11c employed in the ninth embodiment is made by alternately laminating electrode layers 52-k (k=1, 2, 3, . . . , n+1) and piezoelectric ceramic layers 51-k (k=1, 2, 3, . . . , n) in the direction of width so that the electrode layers make the outermost layers as shown in FIG. 13. The electrodes 52-1, 52-3, . . . , 52-n are connected by an electrode 52b formed on one of the principal surfaces, and the electrodes 52-2, 52 4, . . . , 52-(n+1) are connected by an electrode 52a formed on the other principal surface. The piezoelectric ceramic layers 51-k are polarized in the direction of the length of the piezoelectric diaphragm 11c so that adjacent piezoelectric ceramic layers 51-k and 51-(k+1) are polarized in the opposite polarities according to the voltage applied to the piezoelectric ceramic layers 51-k. That is, while the voltage is applied in the direction of the axis of polarization of piezoelectric diaphragm and the strain generated in a direction perpendicular thereto is utilized in the first through the eighth embodiments, the voltage is applied in the same direction as polarization thereby to cause displacement in the direction of polarization (direction of length) in the ninth embodiment.

In the piezoelectric actuator of the ninth embodiment made in the configuration described above, the voltage is applied in the direction of polarization axis thereby to cause displacement in the direction of polarization. In a piezoelectric material in general, piezoelectric constant d33 in the direction of polarization when a voltage is applied in the direction of polarization is higher than piezoelectric constant d31 in the direction perpendicular to the polarization axis when a voltage is applied in the direction of polarization axis, and therefore a large amount of displacement can be obtained with a lower drive voltage than in the cases of the third embodiment and the eighth embodiment. In the ninth embodiment, the displacement in the direction of polarization axis when the voltage is applied in the direction of polarization which is greater than the displacement in the direction perpendicular to the polarization axis when the voltage is applied in the direction of polarization is utilized. For example, piezoelectric constant d31 of a piezoelectric material of PZT type is $185.9 \times 10^{-12}$ m/V and piezoelectric constant d33 is $366.5 \times 10^{-12}$ m/V which is two times greater than d33.

Assume that the number of the piezoelectric ceramic layers 51-k laminated in the piezoelectric diaphragm 11c of the ninth embodiment is n and the drive voltage $V_0$ is applied in the first embodiment, then voltage Vneed 2 required to achieve a displacement comparable to that of the first embodiment is as low as that given by equation 3. This calculation assumes that the piezoelectric diaphragm 11 and the piezoelectric diaphragm 11c have the same profile dimensions. In equation 3, to represents the thickness of the piezoelectric diaphragms 11, 11c and 1 represents the length of piezoelectric diaphragms 11, 11c.

[Equation 3]

$$V\text{need 2} = \{1/(n\, t_0)\} V_0 (d_{31}/d_{33})$$

In the ninth embodiment, as described above, the drive voltage can be decreased in proportion to the directional piezoelectric constant ratio ($d_{31}/d_{33}$), as well as to the thickness (1/n) of the piezoelectric ceramic layers 41-k.

Embodiment 10

Tenth embodiment of the present invention will now be described below.

The tenth embodiment is similar to the first embodiment except that resonance frequency fr1 of the displacement amplifying section 10b, resonance frequency fr2 of the drive section 100 and the frequency of the drive voltage are set to satisfy a predetermined relation as described later.

Figure 14:
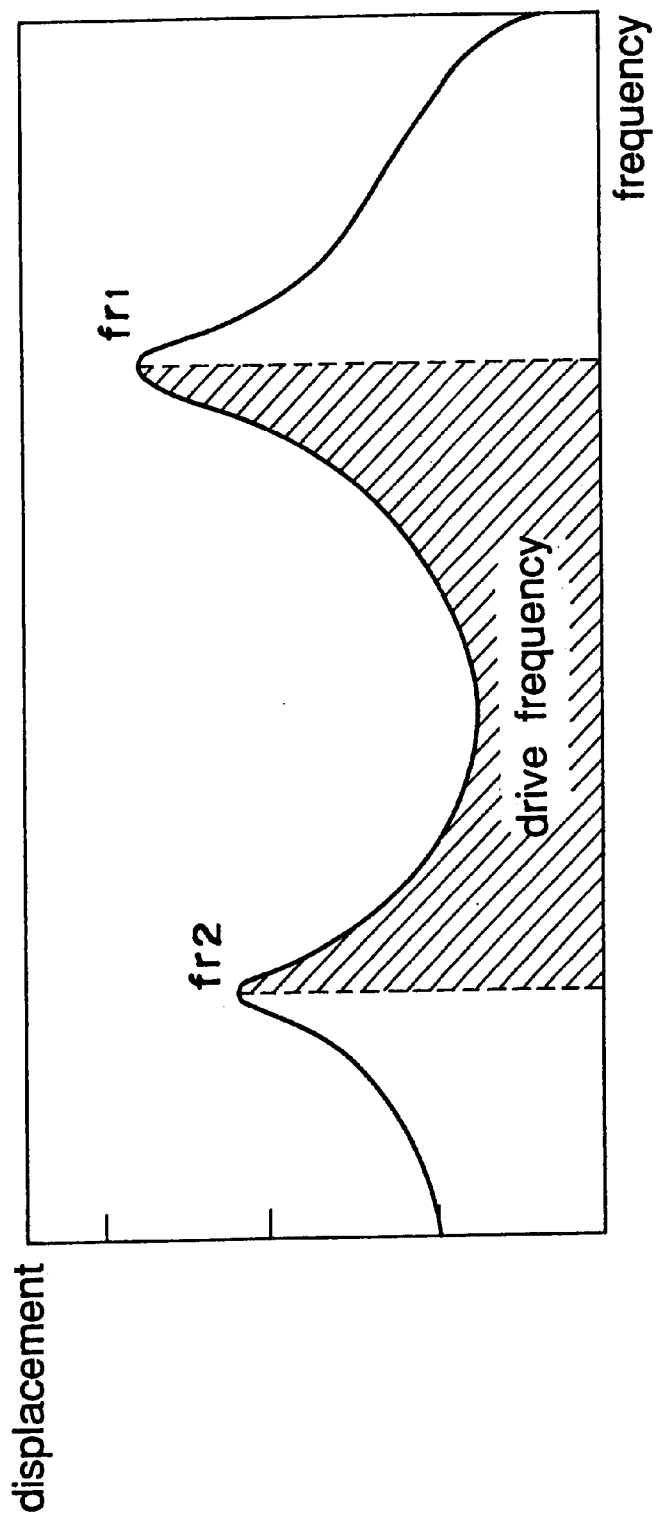
FIG. 14 is a graph showing the frequency characteristic of displacement in the piezoelectric actuator according to the tenth embodiment of the present invention.

Specifically, in the tenth embodiment as shown schematically in FIG. 14, the resonance frequency fr1 of the displacement amplifying section 10b is set to be higher than the resonance frequency fr2 of the drive section 100 and the frequency of the voltage to drive the drive section is set between the resonance frequency fr1 of the displacement amplifying section 10b and the resonance frequency fr2 of the drive section. According to the tenth embodiment, in order to achieve a large amount of displacement by making the displacement amplifying section 10b function efficiently, the resonance frequency fr2 of the drive section 100 is set to be not less than 60% of the resonance frequency fr1 of the displacement amplifying section 10b. This configuration makes it possible for the displacement amplifying section 10b to efficiently amplify the displacement generated by the drive section 100.

Now the relation between the resonance frequency fr2 of the drive section 100, the resonance frequency fr1 of the displacement amplifying section 10b and the displacement will be described below with reference to FIGS. 15 to 21. The displacements shown in FIGS. 15 to 21 are those observed at an end opposite to the end which is connected with the displacement amplifying section 10b.

Figure 15:
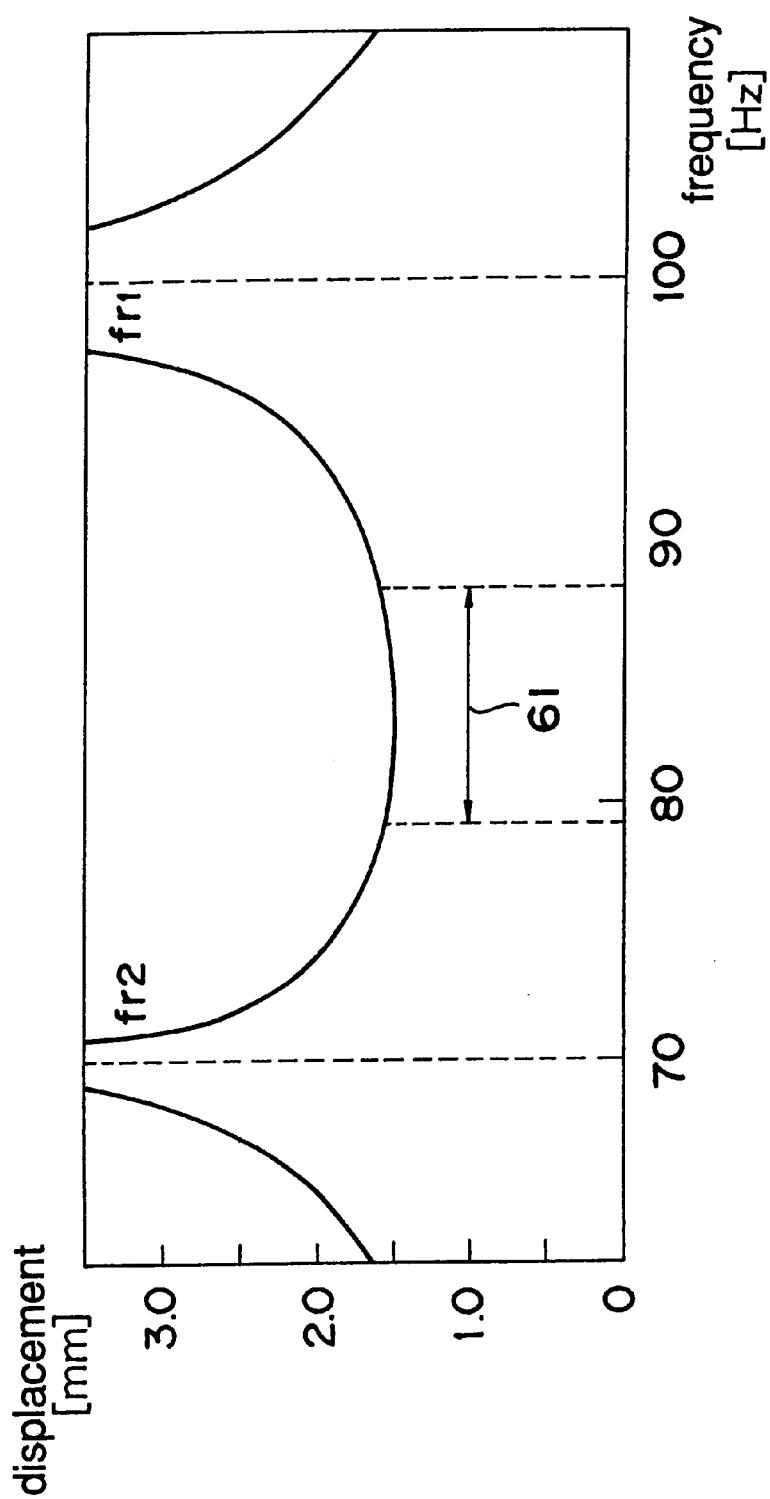
FIG. 15 is a graph showing the frequency characteristic of displacement when the resonance frequency of the displacement amplifying section is set to 100 Hz and the resonance frequency of the drive section is set to 70 Hz in the tenth embodiment.

FIG. 15 is a graph showing the displacement plotted against the drive frequency when the resonance frequency fr2 of the drive section 100 is set to 70 Hz and the resonance frequency fr1 of the displacement amplifying section 10b is set to 100 Hz (fr2=0.7 fr1). From FIG. 15, it can be seen that a relatively large displacement can be achieved in the region between the resonance frequency fr2 and the resonance frequency fr1. FIG. 15 also shows that there is a region indicated with a numeral 61 between the resonance frequency fr2 and the resonance frequency fr1 where the displacement remains substantially constant as the drive frequency changes.

Figure 16:
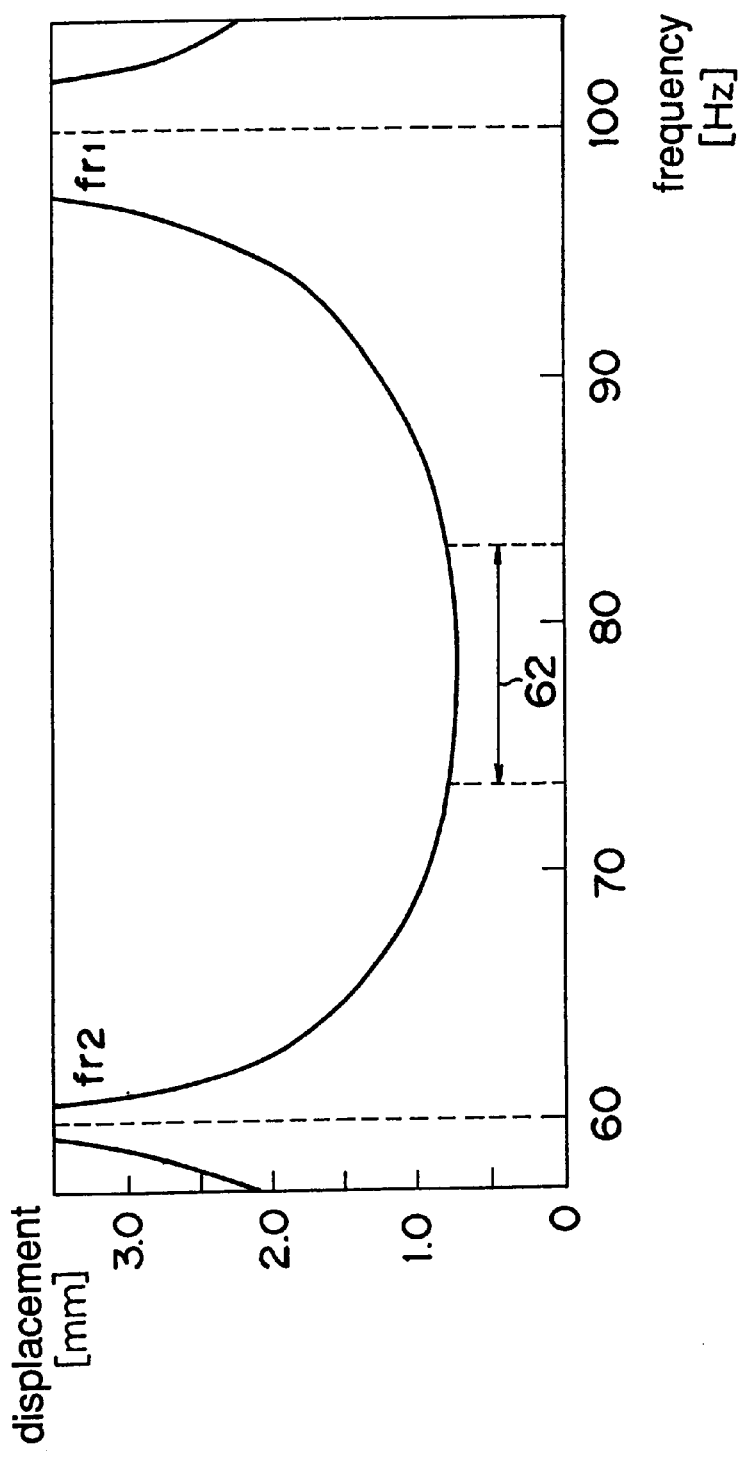
FIG. 16 is a graph showing the frequency characteristic of displacement when the resonance frequency of the displacement amplifying section is set to 100 Hz and the resonance frequency of the drive section is set to 60 Hz in the tenth embodiment.

FIG. 16 is a graph showing the displacement plotted against the drive frequency when the resonance frequency fr2 of the drive section 100 is set to 60 Hz and the resonance frequency fr1 of the displacement amplifying section 10b is set to 100 Hz (fr2=0.6 fr1). From FIG. 16, it can be seen that a relatively large displacement can be achieved in the region between the resonance frequency fr2 and the resonance frequency fr1. FIG. 15 also shows that there is a region indicated with a numeral 62 between the resonance frequency fr2 and the resonance frequency fr1 where the displacement remains substantially constant as the drive frequency changes.

Figure 17:
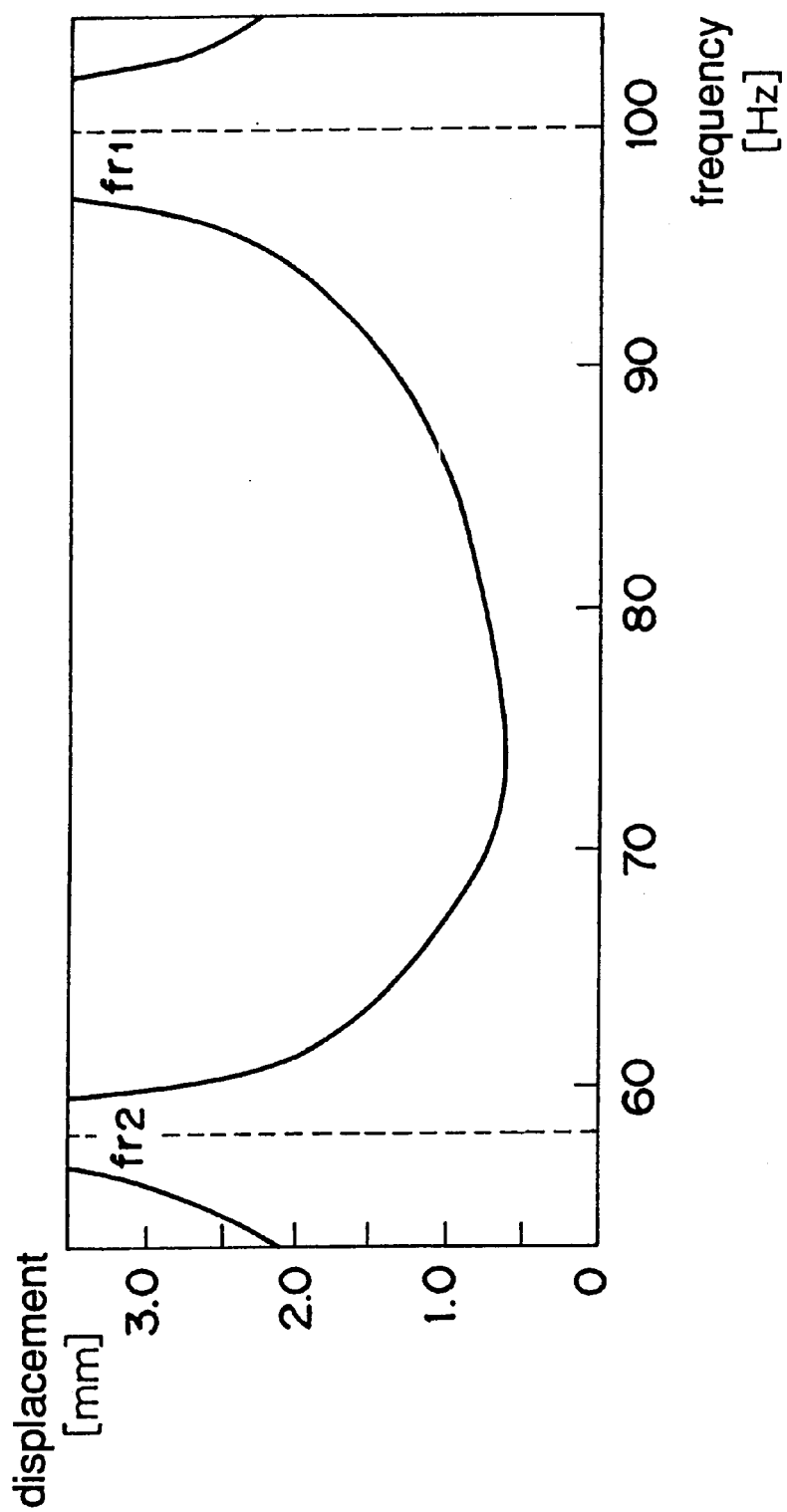
FIG. 17 is a graph showing the frequency characteristic of displacement when the resonance frequency of the displacement amplifying section is set to 100 Hz and the resonance frequency of the drive section is set to 58 Hz in the tenth embodiment.
Figure 18:
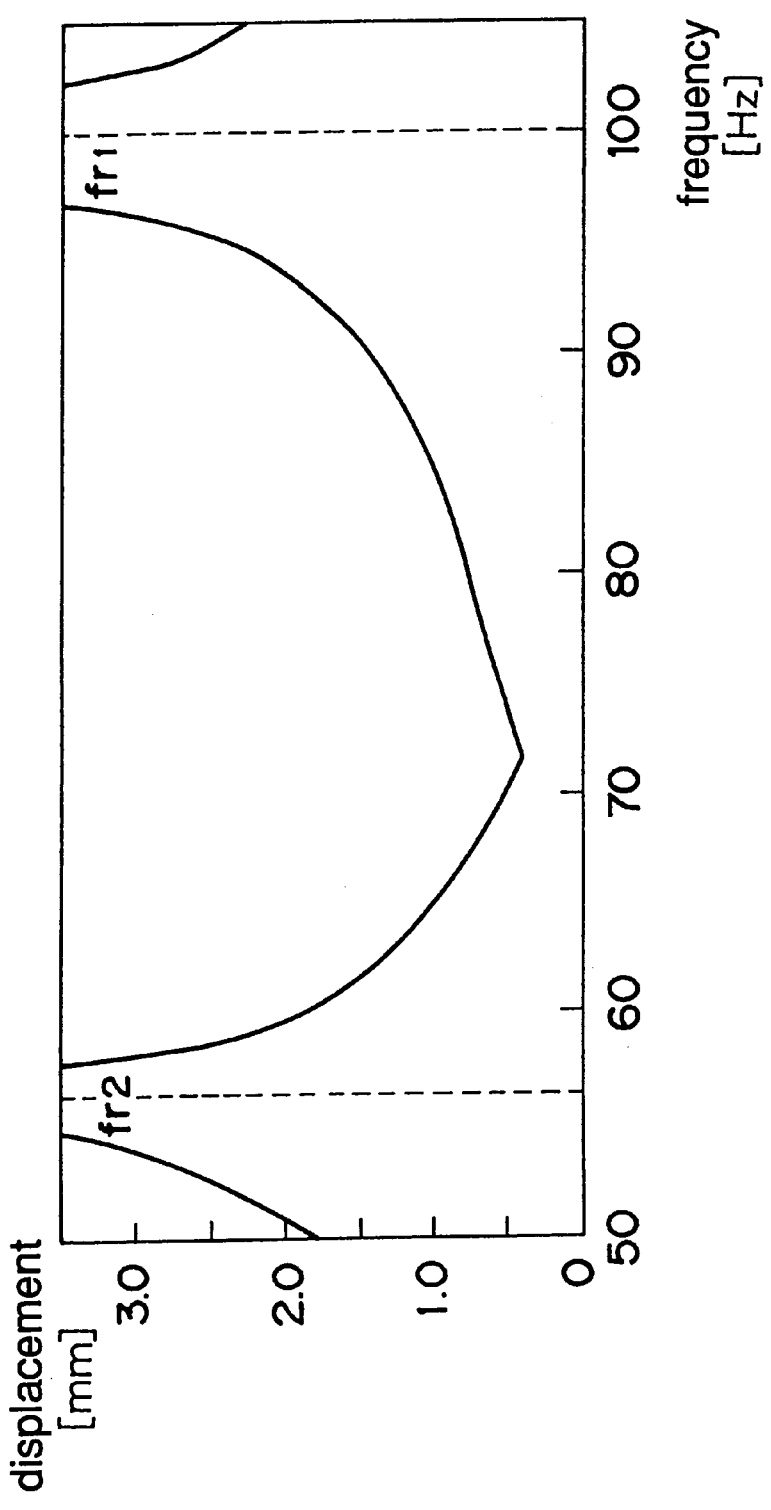
FIG. 18 is a graph showing the frequency characteristic of displacement when the resonance frequency of the displacement amplifying section is set to 100 Hz and the resonance frequency of the drive section is set to 56 Hz in the tenth embodiment.
Figure 19:
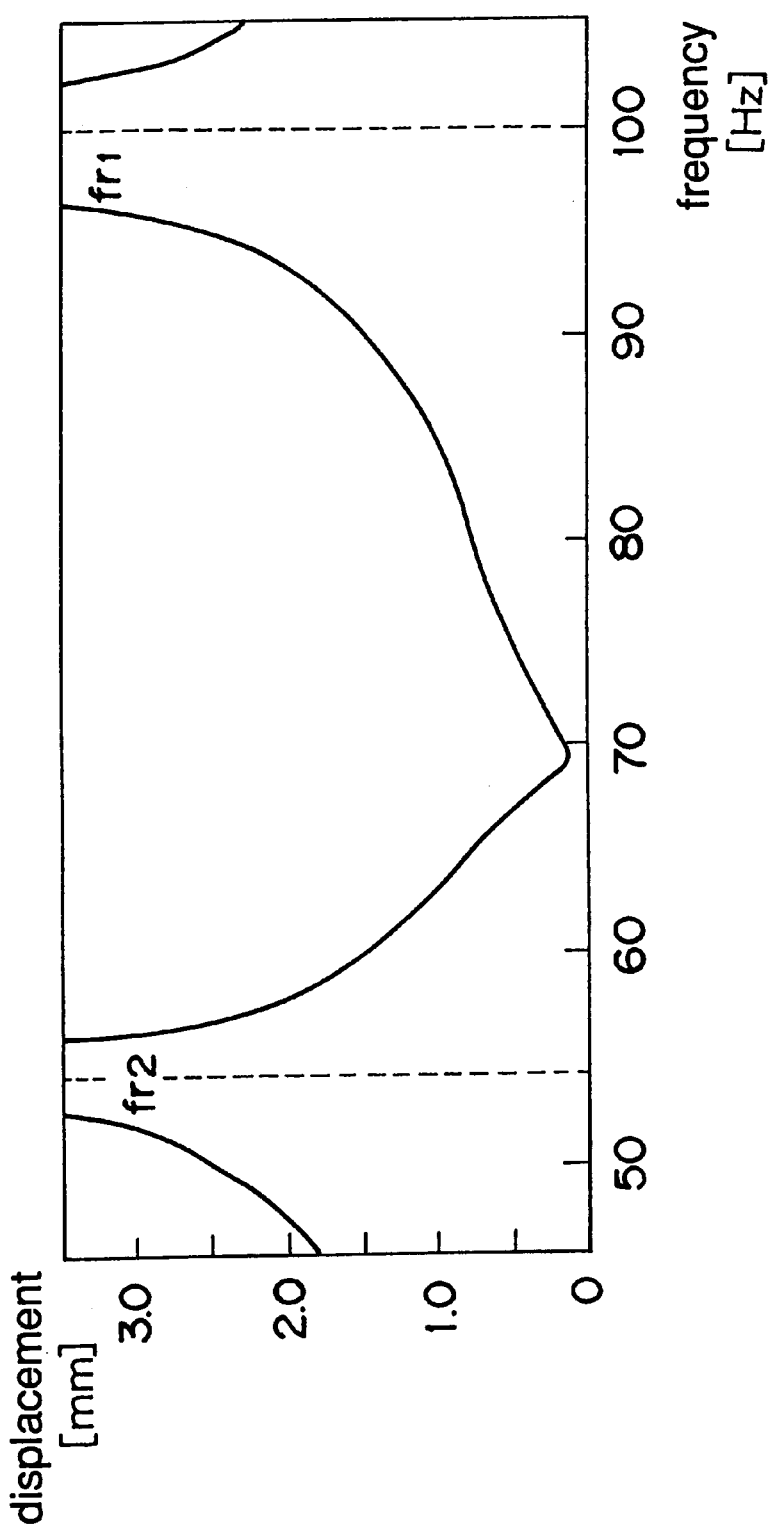
FIG. 19 is a graph showing the frequency characteristic of displacement when the resonance frequency of the displacement amplifying section is set to 100 Hz and the resonance frequency of the drive section is set to 54 Hz in the tenth embodiment.
Figure 20:
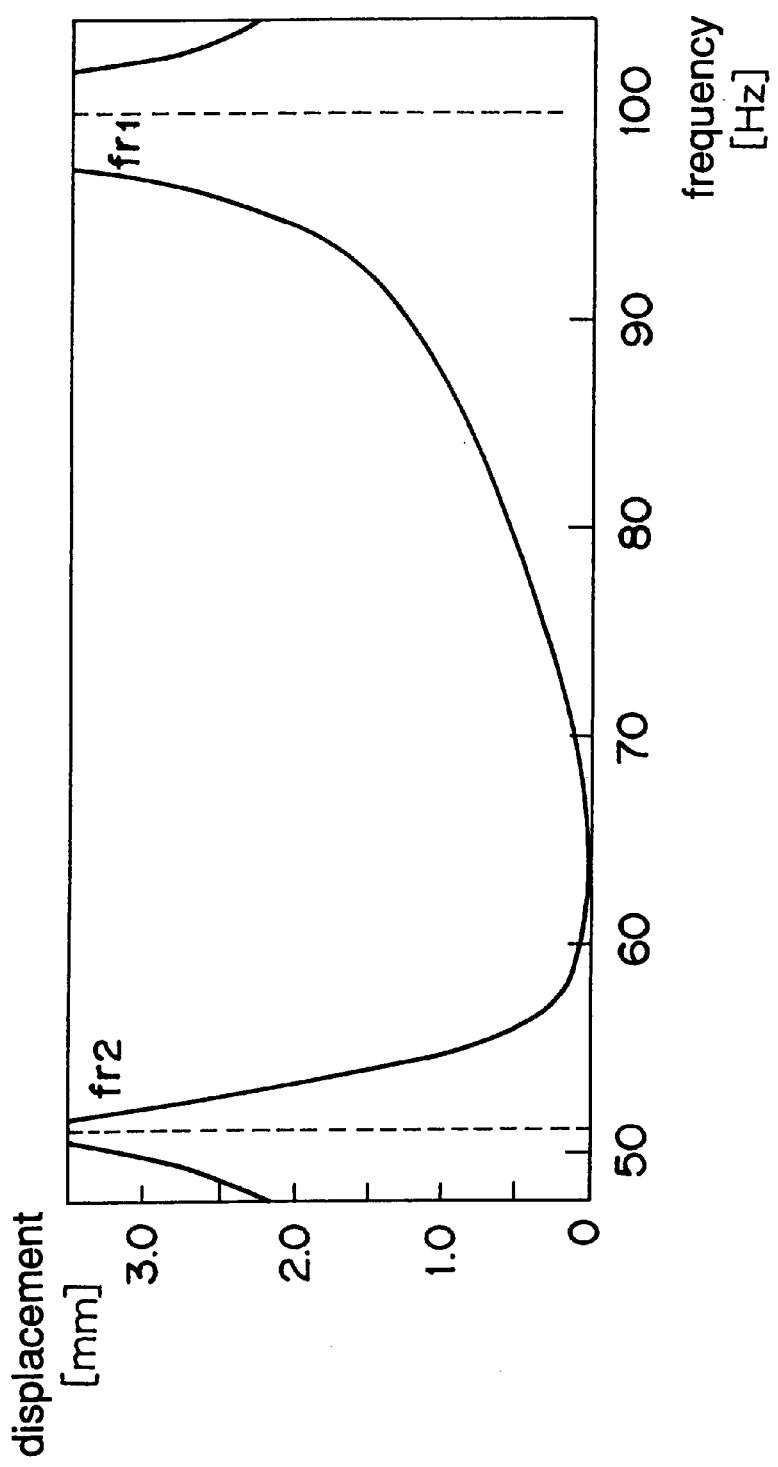
FIG. 20 is a graph showing the frequency characteristic of displacement when the resonance frequency of the displacement amplifying section is set to 100 Hz and the resonance frequency of the drive section is set to 52 Hz in the tenth embodiment.
Figure 21:
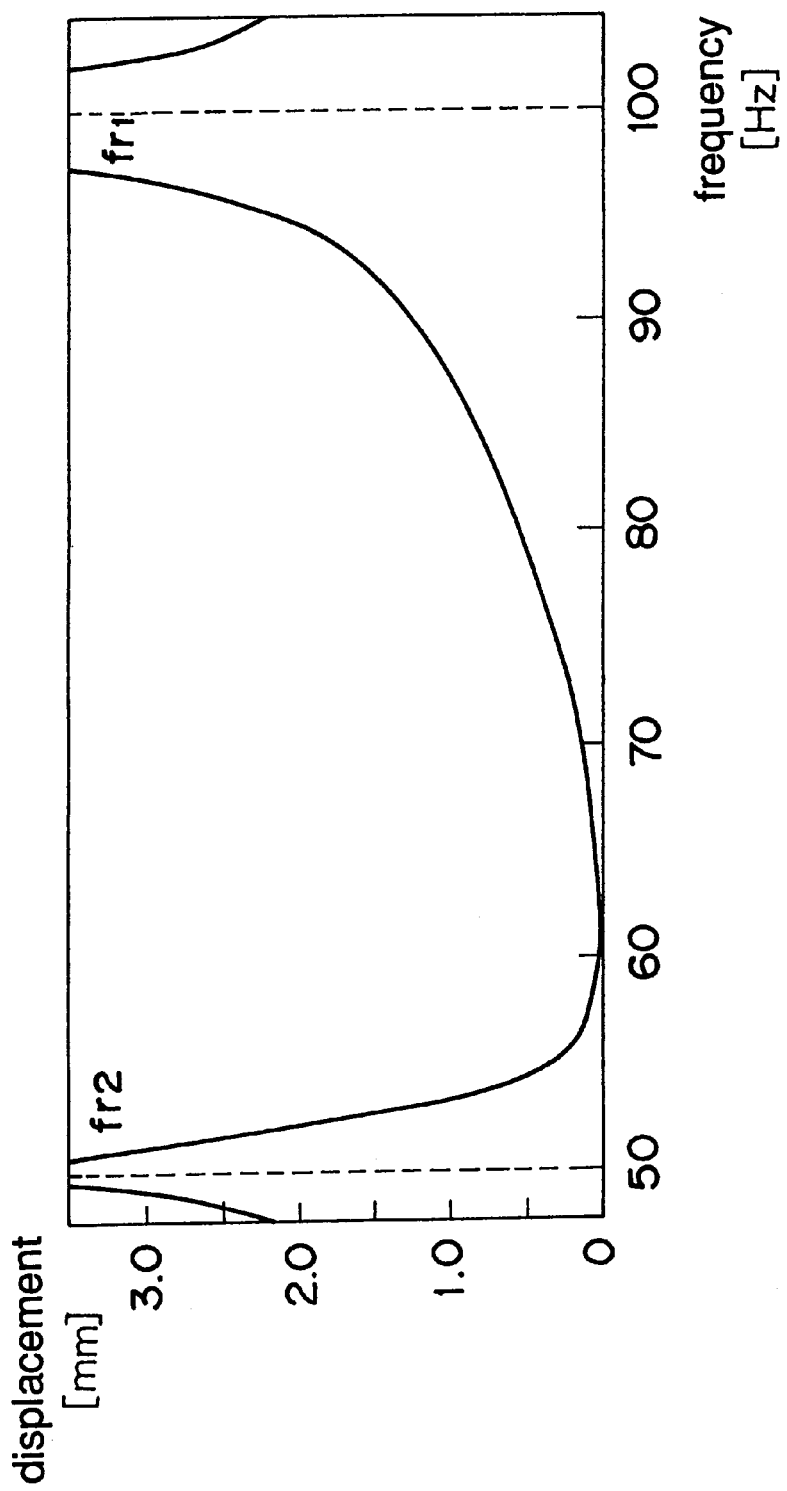
FIG. 21 is a graph showing the frequency characteristic of displacement when the resonance frequency of the displacement amplifying section is set to 100 Hz and the resonance frequency of the drive section is set to 50 Hz in the tenth embodiment.

FIG. 17 is a graph showing the displacement plotted against the drive frequency when the resonance frequency fr2 of the drive section 100 is set to 58 Hz and the resonance frequency fr1 of the displacement amplifying section 10b is set to 100 Hz (fr2=0.58 fr1). From FIG. 17, it can be seen that a large displacement can be achieved when the drive frequency is near the resonance frequency fr2 or the resonance frequency fr1, but the displacement is lower near the center of the region. FIG. 17 also shows that there is not a region between the resonance frequency fr2 and the resonance frequency fr1 where the displacement remains substantially constant as the drive frequency changes.

FIGS. 18, 19, 20 and 21 show the displacement plotted against the drive frequency with the difference between the resonance frequency fr2 of the drive section 100 and the resonance frequency fr1 of the displacement amplifying section 10b increased. As will be clear from FIGS. 18 to 21, displacement obtained with a drive frequency at the center of the region decreases as the difference between the resonance frequency fr2 of the drive section 100 and the resonance frequency fr1 of the displacement amplifying section 10b increases. Thus FIGS. 18 to 21 show that there is no region where the displacement remains substantially constant as the drive frequency changes.

Thus it can be seen from the data shown in FIGS. 15 to 21 that vibration of the drive section 100 and vibration of the displacement amplifying section 10b interact effectively with each other, when the resonance frequency fr2 of the drive section 100 is set to 60% of the resonance frequency fr1 of the displacement amplifying section 10b or higher. This makes it possible to efficiently vibrate the displacement amplifying section 10b by means of vibration of the drive section 100 via the connecting section 10c. When the resonance frequency fr2 of the drive section 100 is set to less than 60% of the resonance frequency fr1 of the displacement amplifying section 10b, interaction between vibration of the drive section 100 and vibration of the displacement amplifying section 10b becomes weaker. This means that vibration of the drive section 100 cannot induce sufficient vibration of the displacement amplifying section 10b when the resonance frequency fr2 is set to less than 60% of the resonance frequency fr1.

According to the tenth embodiment, the drive frequency is preferably set in the frequency region, where the displacement is least affected by the change in the drive frequency, indicated by numerals 61, 62 in FIG. 15 and FIG. 16. This makes it possible to obtain stable output displacement which shows no significant change as the drive frequency changes.

Whether stable displacement can be obtained or not depends on the mechanical quality factor Qm at the resonance frequencies of the drive section 100 and of the displacement amplifying section 10b and on other factors such as piezoelectric constant.

In case the displacement amplifying section 10b has an output pickup section, the drive voltage and the output displacement can be made to change with the same phase regardless of changes in the drive frequency.

When it is intended to obtain larger displacement in the tenth embodiment, the resonance frequency fr1 of the displacement amplifying section 10b is set approximately to the drive frequency. This makes it possible to cause the displacement amplifying section 10b to vibrate with a large amplitude for a small displacement of the drive section (the drive section vibrating with a smaller amplitude results in high reliability of the drive section), thus producing a larger displacement.

Embodiment 11

Figure 22:
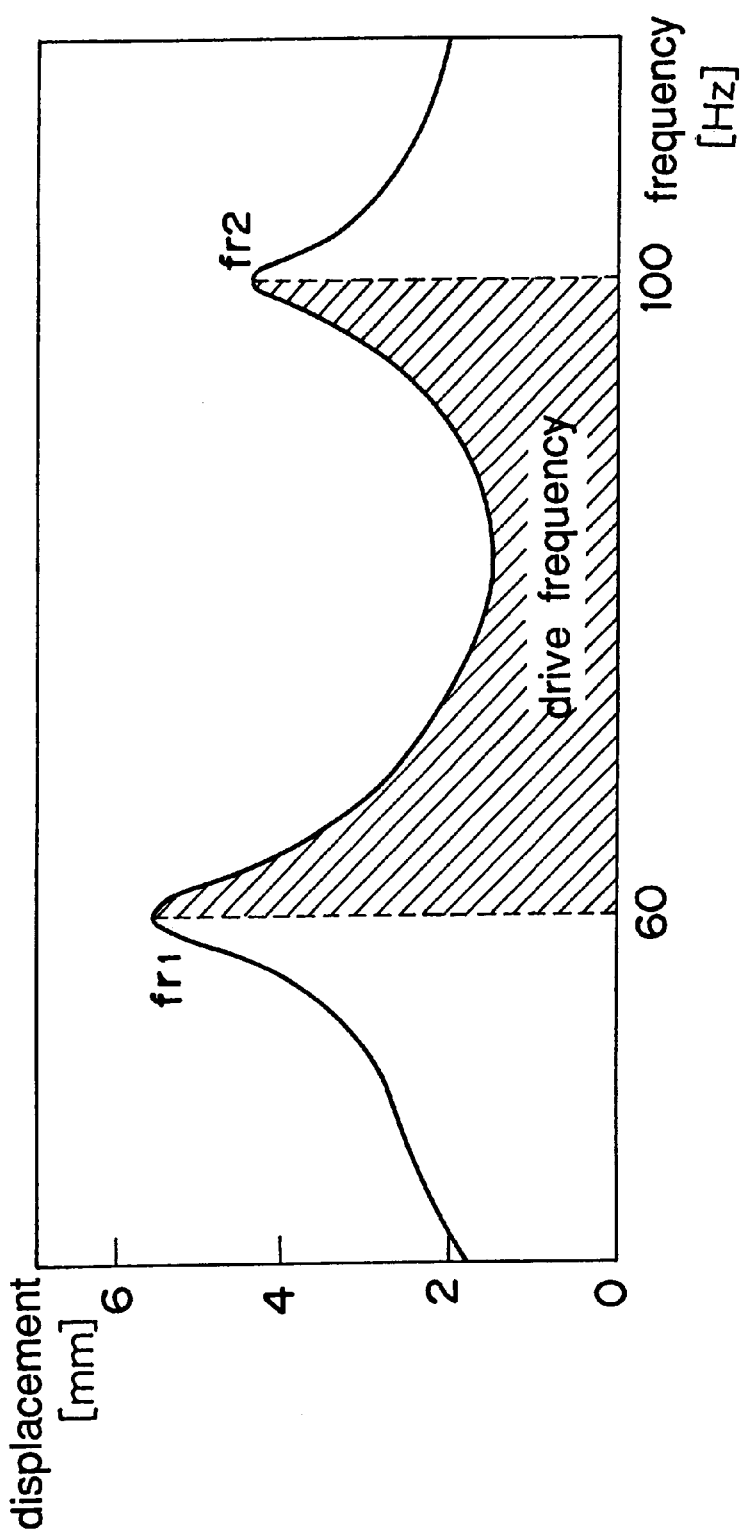
FIG. 22 is a graph showing the frequency characteristic of displacement in the piezoelectric actuator according to the eleventh embodiment of the present invention.

Eleventh embodiment of the present invention is similar to the tenth embodiment, except that, as shown in FIG. 22, the resonance frequency fr1 of the displacement amplifying section 10b is set to be lower than the resonance frequency fr2 of the drive section 100 and the frequency of the voltage to drive the drive section is set between the resonance frequency fr1 of the displacement amplifying section 10b and the resonance frequency fr2 of the drive section.

According to the eleventh embodiment, in order to achieve a large amount of displacement by making the displacement amplifying section 10b function efficiently, the resonance frequency fr1 of the displacement amplifying section 10b is set to be not less than 60% of the resonance frequency fr2 of the drive section. This configuration makes it possible for the displacement amplifying section 10b to efficiently amplify the displacement generated by the drive section 100.

The reason for setting the resonance frequency fr1 of the displacement amplifying section 10b to 60% of the resonance frequency fr2 of the drive section or higher in the eleventh embodiment is similar to that in the case of the tenth embodiment. That is, because stable vibration can be obtained when the resonance frequency fr1 of the displacement amplifying section 10b is set to be not less than 60% of the resonance frequency fr2 of the drive section.

The eleventh embodiment of the configuration described above has the following unique effects in addition to the effects of the tenth embodiment.

Assume that the resonance frequency fr1 of the displacement amplifying section 10b changes by $\Delta$ fr1 and the resonance frequency fr2 of the drive section 100 changes by $\Delta$ fr2 when the ambient temperature changes by $\Delta$ T, where $\Delta$ fr1 $<<\Delta$ fr2. Thus the difference between the resonance frequency fr1 and the resonance frequency fr2 increases and the displacement decreases. Piezoelectric constant of the piezoelectric diaphragm of the drive section, on the contrary, increases as the temperature rises. As a result, according to the eleventh embodiment, influences of the temperature change cancel out each other, leading to a stable characteristic which is less dependent on the temperature.

According to the eleventh embodiment, when an output pickup section is provided on the connecting portion, the drive voltage and the output displacement can be made to change with the same phase regardless of changes in the drive frequency.

The eleventh embodiment also makes it possible to obtain larger displacement, similarly to the tenth embodiment, by setting the resonance frequency of the displacement amplifying section to a value approximate to the drive frequency.

Embodiment 12

Twelfth embodiment of the present invention will be described below.

Figure 23:
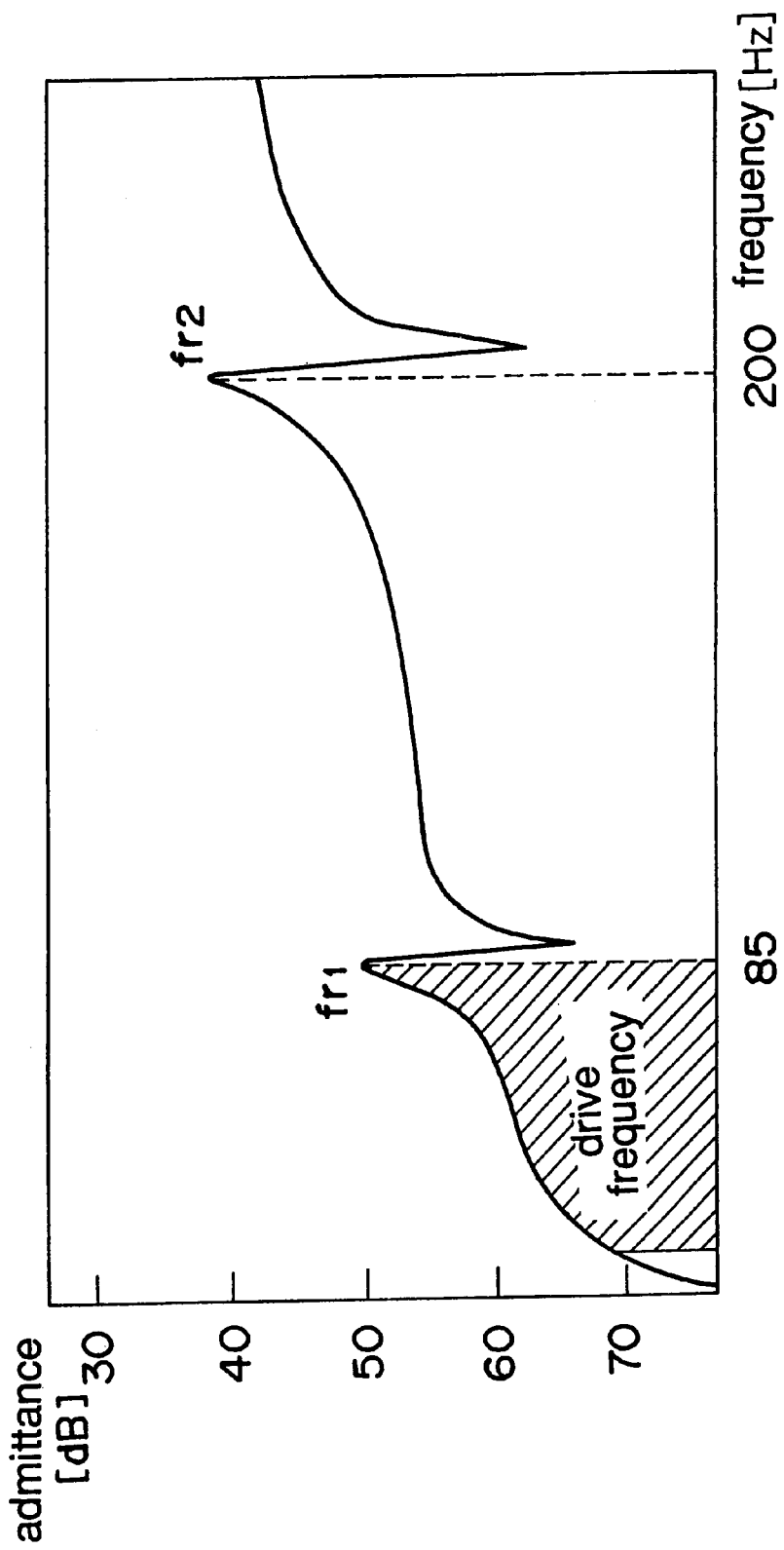
FIG. 23 is a graph showing the frequency characteristic of admittance in the piezoelectric actuator according to the twelfth embodiment of the present invention.

The piezoelectric actuator of the twelfth embodiment is a variation of the piezoelectric actuator of the first embodiment where dimensions of parts are determined so that the piezoelectric actuator has the admittance characteristic shown in FIG. 23 and operates at a frequency at or below the resonance frequency fr1 of the displacement amplifying section 10b. Thus the drive section 100 is caused to vibrate out of resonance thereby suppressing the displacement of the drive section 100 to a small amount and making it possible to suppress the strain sustained by the piezoelectric diaphragm.

Non-resonant vibration of the drive section results in significantly less variation of the displacement due to variation in the resonance frequency caused by changing temperature, variation in the shape and other factor. Thus it is made possible to ensure high reliability of the drive section and vibrate the drive section with a small amplitude and less variation.

According to the twelfth embodiment, it is preferable that the resonance frequency fr1 of the displacement amplifying section 10b be set to a value approximate to the drive frequency, thereby making it possible to greatly amplify the small vibration of the drive section with the displacement amplifying section 10b by making use of the resonance of the displacement amplifying section 10b. The displacement amplifying section 10b consists only of the elastic shim which is made of a thin elastic plate, and therefore has a very high limiting strain. Consequently, reliability of the displacement amplifying section 10b does not deteriorate even when the amplification factor is set to a high value by using a drive frequency approximate to the resonance frequency of the displacement amplifying section, thereby making it possible to make the piezoelectric actuator capable of producing large output displacement with high reliability. Also because a thin metal plate undergoes very little changes in the resonance frequency due to temperature change and other factors, very stable vibration characteristic can be achieved.

While the third to the twelfth embodiments provide configurations which add new technological aspects to the configuration of the first embodiment, the present invention is not limited to these configurations and the technological aspects of the third to the twelfth embodiments may also be applied to the third embodiment or other achieving similar effects. For example, when the laminated piezoelectric diaphragms 11a, 11b, 11c of the third to the ninth embodiments are used in the second embodiment, larger output displacement can be obtained with further lower drive voltage than that of the second embodiment. Also when the resonance frequencies and the drive frequency are set similarly to the sixth to the twelfth embodiments in the second embodiment, effects similar to those of the sixth to the twelfth embodiments can be obtained.

Embodiment 13

Figure 24:
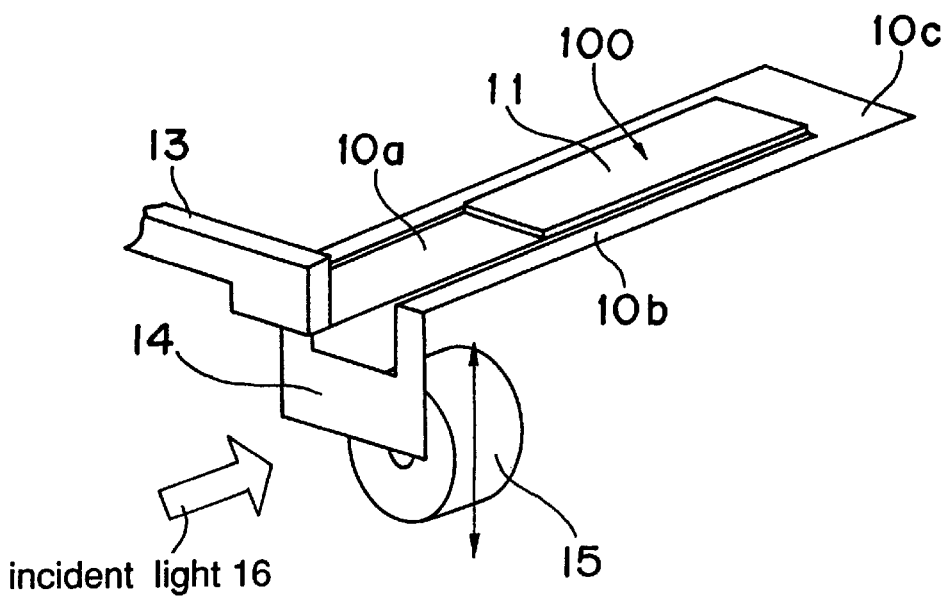
FIG. 24 is a perspective view schematically showing the configuration of the infrared sensor according to the thirteenth embodiment of the present invention.

Now an infrared sensor of the thirteenth embodiment will be described below. The infrared sensor of the thirteenth embodiment is made by bending the tip of the displacement amplifying section 10b of the piezoelectric actuator shown in FIG. 3 substantially at right angles thereby to form a shading plate 14 which interrupts infrared ray, and disposing an infrared sensor 15 so as to receive incident light 16 which is allowed to enter intermittently by reciprocal motion of the shading plate 14 due to flexural oscillation of the displacement amplifying section 10b, as shown in FIG. 24.

The infrared sensor of the thirteenth embodiment of the configuration described above is small in size and can be operated with a low voltage, since the piezoelectric actuator of the first embodiment which is used to make the chopper can be made small in size and produce stable displacement of a large magnitude with a low voltage.

The infrared sensor of the thirteenth embodiment can be used, for example, in precise temperature measurement.

Figure 25:
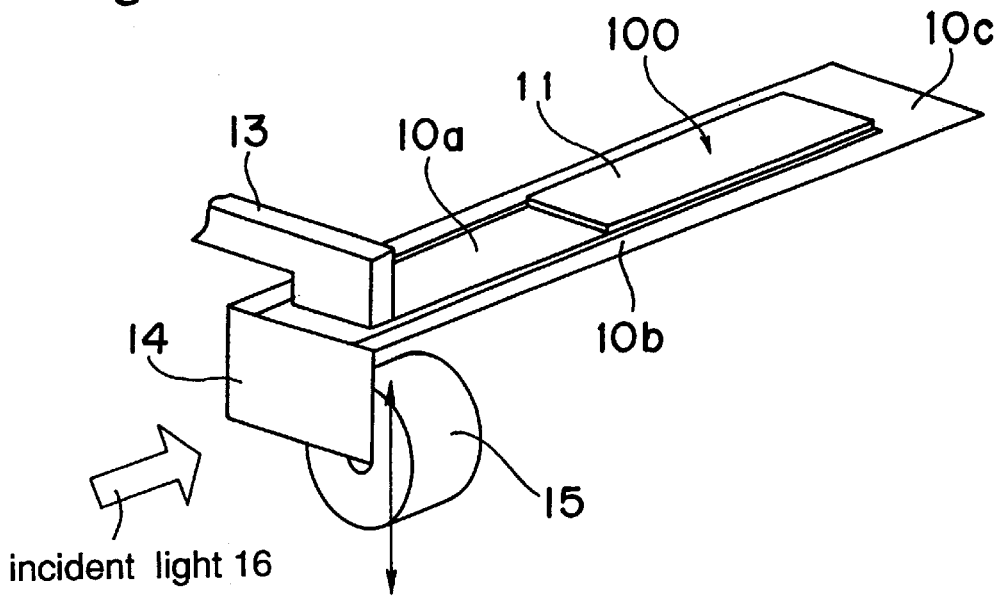
FIG. 25 is a perspective view schematically showing the configuration of the infrared sensor of a variation according to the thirteenth embodiment of the present invention.

According to the thirteenth embodiment, the shading plate 14 may also be disposed to protrude to the outside of the drive section 10 as shown in FIG. 25.

Embodiment 14

Figure 26:
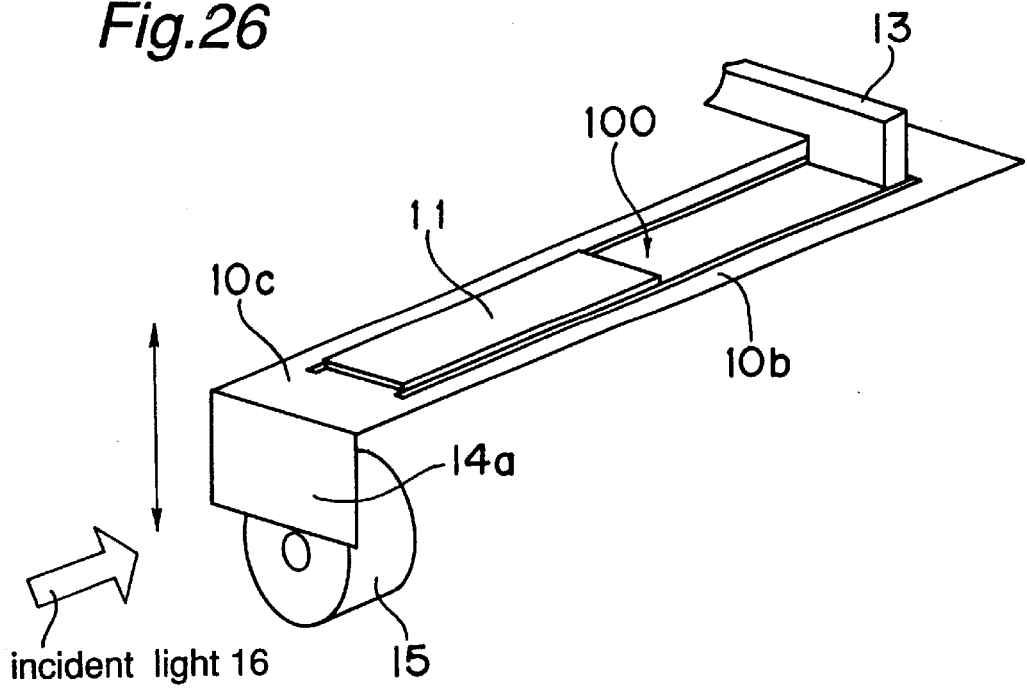
FIG. 26 is a perspective view schematically showing the configuration of the infrared sensor according to the fourteenth embodiment of the present invention.

The infrared sensor of the fourteenth embodiment of the present invention is made by bending the tip of the linkage section 10c of the piezoelectric actuator shown in FIG. 4 substantially at right angles thereby to form the shading plate 14a which interrupts infrared ray, and disposing the infrared sensor 15 so as to receive incident light 16 which is allowed to enter intermittently by reciprocal motion of the shading plate 14a, as shown in FIG. 26. This configuration also has the effects similar to those of the thirteenth embodiment.

Embodiment 15

Figure 27:
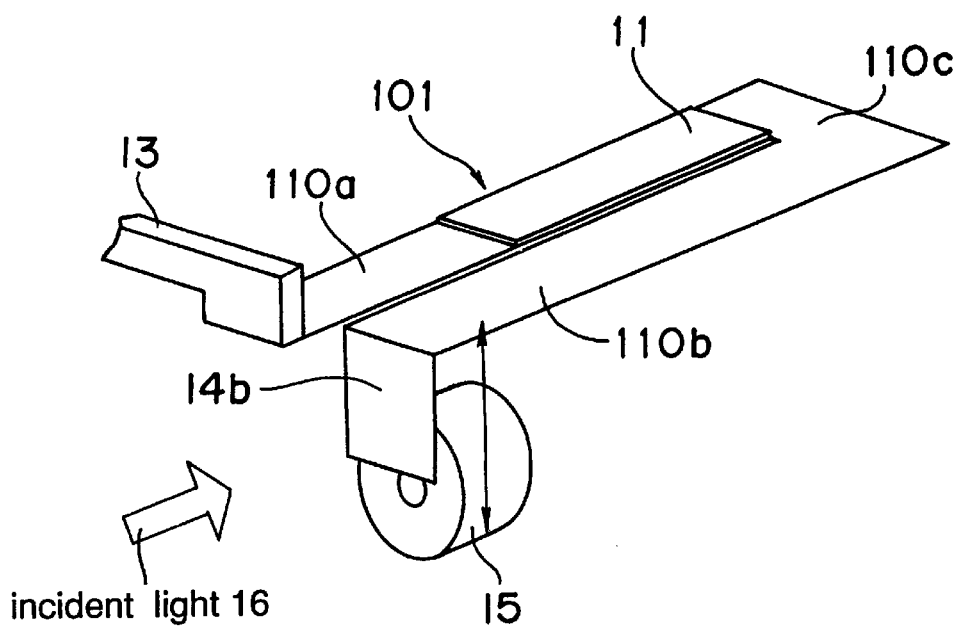
FIG. 27 is a perspective view schematically showing the configuration of the infrared sensor according to the fifteenth embodiment of the present invention.

The infrared sensor of the fifteenth embodiment of the present invention is made by bending the tip of the displacement amplifying section 110b of the piezoelectric actuator shown in FIG. 6 substantially at right angles thereby to form the shading plate 14b which interrupts infrared ray, and disposing the infrared sensor 15 so as to receive incident light 16 which is allowed to enter intermittently by reciprocal motion of the shading plate 14b, as shown in FIG. 27.

The infrared sensor of the fifteenth embodiment of the configuration described above can be made further smaller in size and operated with a lower drive voltage than in the case of the thirteenth embodiment, since the piezoelectric actuator of the third embodiment which can be made smaller in size and produce larger displacement.

Figure 28:
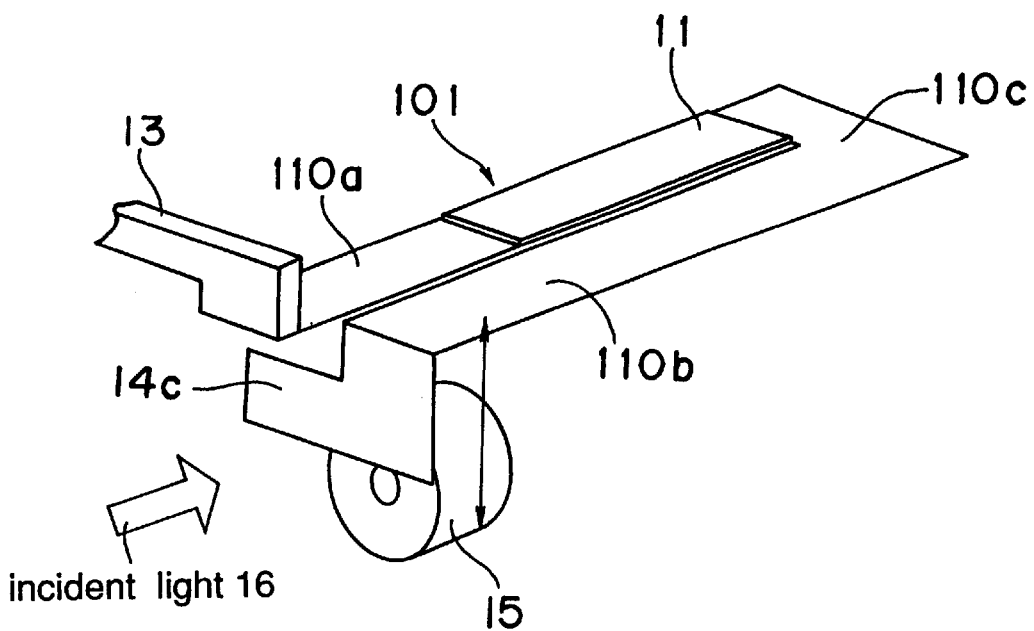
FIG. 28 is a perspective view schematically showing the configuration of the infrared sensor of a variation according to the present invention.

Although the shading plate is formed in simple square shapes in the thirteenth to the fifteenth embodiments, the present invention is not limited to this configuration and the shading plate may also be formed in a shape indicated with the numeral 14c in FIG. 28. Thus the infrared sensor of the present invention is not restricted by the shape of the shading plate and shading plates of various shapes can be used.

Although the shading plate is formed bending the displacement amplifying section or the connecting section in the thirteenth to the fifteenth embodiments, the present invention is not limited to this configuration and the shading plate may also be mounted as a separate member. Effects similar to those of the thirteenth to the fifteenth embodiments can be achieved with such a configuration as described above.

Embodiment 16

The piezoelectric light deflector according to the sixteenth embodiment of the present invention will be described below with reference to the accompanying drawing.

Figure 29:
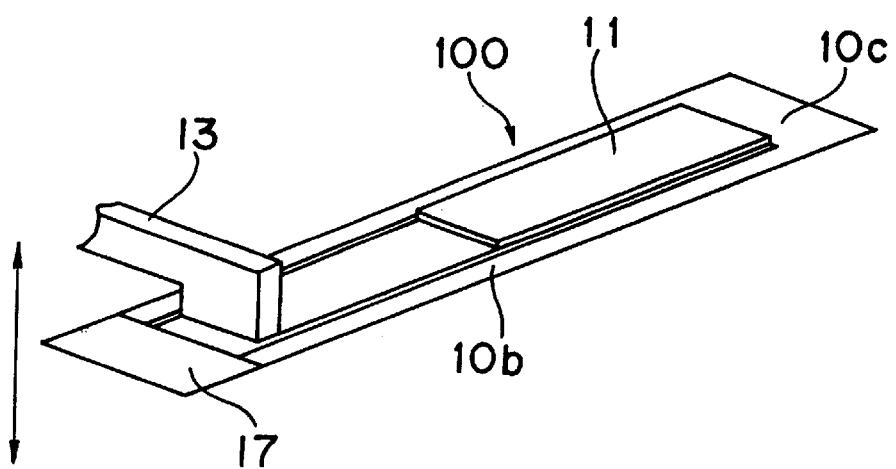
FIG. 29 is a perspective view schematically showing the configuration of the piezoelectric light deflector according to the sixteenth embodiment of the present invention.

The piezoelectric light deflector of the sixteenth embodiment is made by mounting a reflector 17 at the tip of the displacement amplifying section 10b of the piezoelectric actuator shown in FIG. 3 as shown in FIG. 29. The reflector 17 may be either provided as a separate member or made by using a part of the displacement amplifying section.

Operation of the piezoelectric light deflector made in the configuration described above will be described below with reference to FIGS. 29 and 30.

Figure 30:
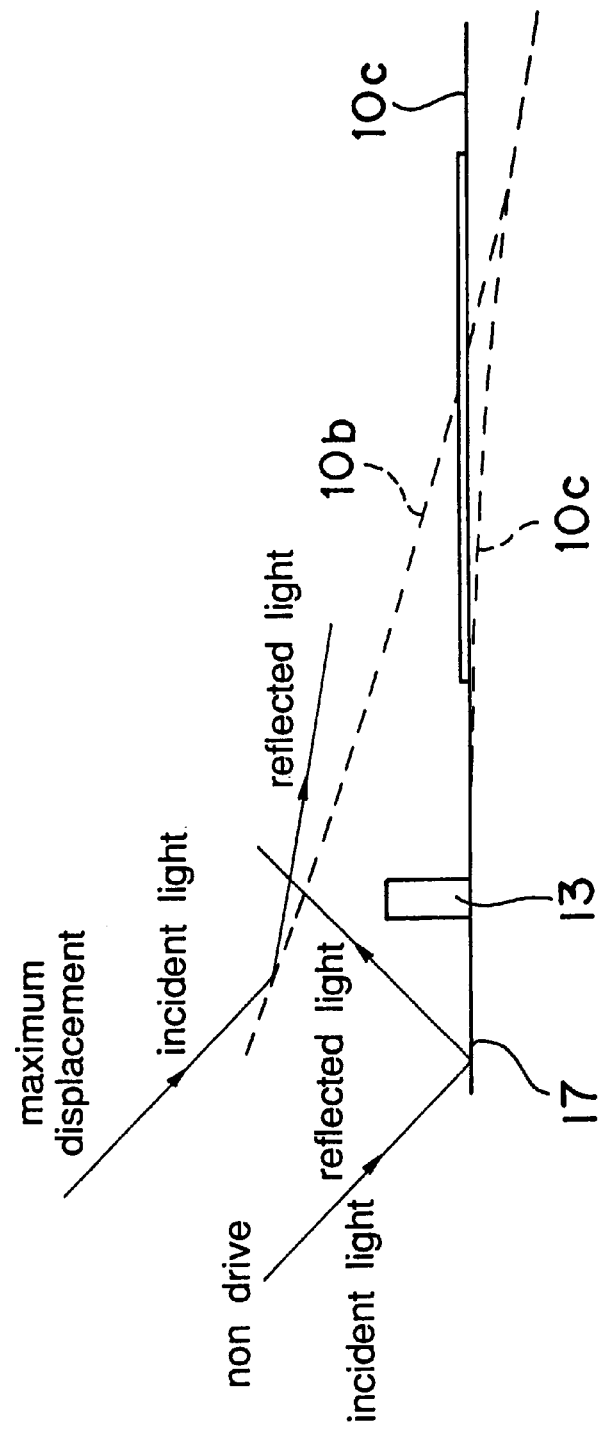
FIG. 30 is a schematic diagram showing the light deflecting operation of the piezoelectric light deflector according to the sixteenth embodiment.

In FIG. 30, the solid line indicates a state of not in operation (neutral position) and the dashed line indicates a state of maximum displacement.

In the piezoelectric light deflector, the reflector 17 makes reciprocal motion in the direction indicated by an arrow in FIG. 29. At the same time, the connecting section 10c makes displacement with a phase opposite to that of the reflector 17.

Interaction of these factors causes a great change in the angle of the reflector 17, thus making it possible to deflect the incident light greatly.

The piezoelectric light deflector made in the configuration described above is simple in construction and allows for easy control of the amount of deflection and a large deflection angle.

While an example of the piezoelectric light deflector made by using the piezoelectric actuator of FIG. 3 is described above, the piezoelectric light deflector may also be made by using the other piezoelectric actuators of the present invention.

Industrial Applicability

The piezoelectric actuator according to the present invention produces a large amount of displacement with a low drive voltage and can operate with high stability and be made small in size, and therefore can be used in various applications including pyroelectric infrared sensor and piezoelectric light deflector, while contributing to the improvement of reliability of the apparatuses.

The pyroelectric infrared sensor of the present invention is provided with the chopper made by using the piezoelectric actuator of the present invention, and therefore provides desired characteristics with a relatively low drive voltage and has extremely high stability and reliability. The pyroelectric infrared sensor can be used in wide applications of measuring the temperatures of objects.

The piezoelectric light deflector of the present invention is made by using the piezoelectric actuator of the present invention, and therefore provides desired light deflecting characteristics with a relatively low drive voltage and has extremely high stability and reliability. The piezoelectric light deflector can be used in wide applications such as bar code reader.

What is claimed is:

1. A piezoelectric actuator comprising:
   a drive section, including a thin elastic plate bonded to a piezoelectric diaphragm, said piezoelectric diaphragm being operable to expand and contract in a longitudinal direction perpendicular to the direction of thickness in correspondence to a voltage applied across the thickness of said piezoelectric diaphragm, and said drive section being operable to undergo flexural oscillation at a frequency of a drive voltage of a predetermined frequency applied across the thickness of said piezoelectric diaphragm; and
   a displacement amplifying section disposed in a same plane as said drive section on at least one side of said drive section along the longitudinal direction, capable of vibrating in synchronization with the flexural oscillation of said drive section and connected with said drive section to be vibrated by the vibration of said drive section, so as to amplify the vibration of said drive section, wherein vibration of said drive section is amplified by said displacement amplifying section.

2. A piezoelectric actuator according to claim 1, wherein said displacement amplifying section consist of thin elastic plate formed integrally with said thin elastic plate of said drive section.

3. A piezoelectric actuator according to claim 2, wherein one end of said displacement amplifying section is connected with one end of said elastic plate of said drive section.

4. A piezoelectric actuator according to claim 3, wherein said piezoelectric actuator is supported at the other end of said thin elastic plate of said drive section.

5. A piezoelectric actuator according to claim 3, wherein said piezoelectric actuator is supported at a connecting portion of said thin elastic plate of said drive section and said displacement amplifying section.

6. A piezoelectric actuator according to claim 1, wherein said piezoelectric diaphragm comprises alternately laminated electrode layers and piezoelectric layers in the direction of thickness of said piezoelectric diaphragm with electrode layers placed at the top and bottom, and a drive voltage is applied to each piezoelectric layer via the electrode layers disposed at the upper face and lower face the piezoelectric layer.

7. A piezoelectric actuator according to claim 6, wherein one of a pair of electrode layers which interpose each of said piezoelectric layers of said piezoelectric diaphragm is formed so that one side face of the electrode layer is located inside of one side face of said piezoelectric diaphragm and the other electrode layer is formed so that one side face thereof is located inside of said other side face of the piezoelectric diaphragm.

8. A piezoelectric actuator according to claim 7, wherein one of the pair of electrode layers which interpose each of said piezoelectric layers of said piezoelectric diaphragm is formed so that one edge of the electrode layer is located inside of one edge of said piezoelectric diaphragm and the other electrode layer is formed so that one edge thereof is located inside of the other edge of said piezoelectric diaphragm.

9. A piezoelectric actuator according to claim 7, wherein each electrode layer is formed so that both edges of the each electrode layer are located inside of edge of said piezoelectric diaphragm.

10. A piezoelectric actuator according to claim 6, wherein each of said electrode layers has a protruding electrode on one of the edges thereof and is formed so that edges and side faces of said electrode layer are located inside of the edges and the side faces of said piezoelectric diaphragm, respectively, except that the tip of said protruding electrode is exposed on one of the edges of said piezoelectric diaphragm; and said protruding electrode is connected via every other connecting electrode formed on the edge of the piezoelectric diaphragm.

11. A piezoelectric actuator according to claim 10, wherein an insulator is formed for insulating said connection electrode and said thin elastic plate of said drive section at a position where one of said connection electrodes provided on said thin elastic plate of said drive section would be located when bonding said piezoelectric diaphragm and said thin elastic plate of said drive section.

12. A piezoelectric actuator according to claim 6, wherein each of said electrode layers has a protruding electrode on one of the side faces thereof and is formed so that said edges and the side faces of the electrode layer are located inside of the edges and the side faces of said piezoelectric diaphragm, respectively, except that the tip of the protruding electrode is exposed on one of the side faces of said piezoelectric diaphragm; and said protruding electrode is connected via every other connecting electrode formed on one of the side faces of said piezoelectric diaphragm.

13. A piezoelectric actuator according to claim 12, wherein said thin elastic plate of said drive section is made smaller in width than said piezoelectric diaphragm, and said thin elastic plate of said drive section and said piezoelectric diaphragm are bonded to each other so that one of the side faces of said thin elastic plate of said drive section is located inside of the side face of said piezoelectric diaphragm.

14. A piezoelectric actuator according to claim 12, wherein a notch is formed for insulating said connection electrode and said thin elastic plate of said drive section at a position where one of said connection electrodes provided on said thin elastic plate of drive section would be located when bonding said thin elastic plate of said drive section and said piezoelectric diaphragm.

15. A piezoelectric actuator according to claim 12, wherein an insulator is formed for insulating said connection electrode and said thin elastic plate of said drive section at a position where one of said connection electrodes provided on said thin elastic plate of said drive section would be located when bonding said thin elastic plate of said drive section and said piezoelectric diaphragm.

16. A piezoelectric actuator according to claim 6, wherein each of said electrode layers has a protruding electrode for connecting the electrodes to each other at one edge of said piezoelectric diaphragm with said protruding electrodes being disposed to oppose each other in a staggered arrangement, and the opposing protruding electrodes are connected to each other via a connection electrode formed in a through hole.

17. A piezoelectric actuator according to claim 6, wherein a surface electrode, which is formed on a surface of said piezoelectric diaphragm located opposite to a surface whereon it is bonded onto said thin elastic plate of said drive section, and each of said connection electrodes are connected to each other, and the surface electrode connected to one of said connection electrode is insulated from said other surface electrode.

18. A piezoelectric actuator according to claim 6, wherein the other electrode insulated from the surface electrode is formed on the surface electrode, which is formed on the surface whereon said piezoelectric diaphragm is bonded onto said thin elastic plate of said drive section, and one of said connection electrodes is connected to said surface electrode and said other connection electrode is connected to said other electrode.

19. A piezoelectric actuator according to claim 18, wherein an electrode insulated from said thin elastic plate of said drive section by an insulation layer is formed on said thin elastic plate of said drive section so as to oppose said other electrode when said piezoelectric diaphragm and said thin elastic plate of said drive section are bonded to each other, and a drive voltage is applied between said electrode and said thin elastic plate of said drive section.

20. A piezoelectric actuator as in claim 1, wherein said piezoelectric diaphragm comprises alternately laminated electrode layers and piezoelectric layers in the direction of width of said piezoelectric diaphragm so that electrode layers are placed at the top and bottom of said piezoelectric diaphragm, and a drive voltage is applied to each piezoelectric layer via the electrode layers disposed to interpose said piezoelectric layer therebetween.

21. A piezoelectric actuator as in claim 1, wherein said piezoelectric diaphragm comprises alternately laminated electrode layers and piezoelectric layers in the longitudinal direction of said piezoelectric diaphragm so that electrode layers are placed both end faces of said piezoelectric diaphragm, and a drive voltage is applied to each piezoelectric layer via said electrode layers disposed to interpose said piezoelectric layer therebetween.

22. A piezoelectric actuator as in claim 1, wherein the resonance frequency of said drive section and the resonance frequency of said displacement amplifying section are set so that the lower resonance frequency is 0.6 times the higher resonance frequency or higher, and the frequency of the drive voltage is set to a value between the resonance frequency of said drive section and the resonance frequency of said displacement amplifying section.

23. A piezoelectric actuator according to claim 22, wherein the frequency of the drive voltage is set in a stable region where amount of displacement does not undergo substantial change as the frequency changes.

24. A piezoelectric actuator according to claim 23, wherein the resonance frequency of said displacement amplifying section is set lower than the resonance frequency of said drive section.

25. A piezoelectric actuator according to claim 23, wherein the resonance frequency of said displacement amplifying section is set higher than the resonance frequency of said drive section.

26. A piezoelectric actuator as in claim 1, wherein the resonance frequency of said drive section is set higher than the resonance frequency of said displacement amplifying section, and the frequency of the drive voltage is set to a frequency not higher than the resonance frequency of said displacement amplifying section.

27. A piezoelectric actuator according to claim 26, wherein the resonance frequency of said drive section is set to 1.5 times the frequency of the drive voltage or higher, and the resonance frequency of said displacement amplifying section is set approximately to the frequency of the drive voltage.

28. A pyroelectric infrared sensor comprising a chopper including the piezoelectric actuator according to claim 6 and a shading plate disposed substantially at right angles on said displacement amplifying section or the connecting section of said piezoelectric actuator, and an infrared sensor which has an infrared ray receiving section and is disposed so that said shading plate is located in front of the infrared ray receiving section; wherein said infrared sensor receives infrared ray intermittently incident thereon as said piezoelectric actuator is operated by a drive voltage having a predetermined frequency.

29. A piezoelectric light deflector comprising the piezoelectric actuator according to claim 6 and a reflector disposed substantially parallel to said displacement amplifying section on at least a part of said displacement amplifying section of said piezoelectric actuator; wherein direction of light reflected by said reflector is changed by operating said piezoelectric actuator by a drive voltage having a predetermined frequency.

30. A piezoelectric actuator according to claim 2, wherein said piezoelectric diaphragm comprises alternately laminated electrode layers and piezoelectric layers in the direction of thickness of said piezoelectric diaphragm with electrode layers placed at the top and bottom, and a drive voltage is applied to each piezoelectric layer via the electrode layers disposed at the upper face and lower face the piezoelectric layer.

31. A piezoelectric actuator according to claim 3, wherein said piezoelectric diaphragm comprises alternately laminated electrode layers and piezoelectric layers in the direction of thickness of said piezoelectric diaphragm with electrode layers placed at the top and bottom, and a drive voltage is applied to each piezoelectric layer via the electrode layers disposed at the upper face and lower face the piezoelectric layer.

32. A piezoelectric actuator according to claim 4, wherein said piezoelectric diaphragm comprises alternately laminated electrode layers and piezoelectric layers in the direction of thickness of said piezoelectric diaphragm with electrode layers placed at the top and bottom, and a drive voltage is applied to each piezoelectric layer via the electrode layers disposed at the upper face and lower face the piezoelectric layer.

33. A piezoelectric actuator according to claim 5, wherein said piezoelectric diaphragm comprises alternately laminated electrode layers and piezoelectric layers in the direction of thickness of said piezoelectric diaphragm with electrode layers placed at the top and bottom, and a drive voltage is applied to each piezoelectric layer via the electrode layers disposed at the upper face and lower face the piezoelectric layer.

34. A piezoelectric actuator as in claim 2, wherein said piezoelectric diaphragm comprises alternately laminated electrode layers and piezoelectric layers in the direction of width of said piezoelectric diaphragm so that electrode layers are placed at the top and bottom of said piezoelectric diaphragm, and a drive voltage is applied to each piezoelectric layer via the electrode layers disposed to interpose said piezoelectric layer therebetween.

35. A piezoelectric actuator as in claim 3, wherein said piezoelectric diaphragm comprises alternately laminated electrode layers and piezoelectric layers in the direction of width of said piezoelectric diaphragm so that electrode layers are placed at the top and bottom of said piezoelectric diaphragm, and a drive voltage is applied to each piezoelectric layer via the electrode layers disposed to interpose said piezoelectric layer therebetween.

36. A piezoelectric actuator as in claim 4, wherein said piezoelectric diaphragm comprises alternately laminated electrode layers and piezoelectric layers in the direction of width of said piezoelectric diaphragm so that electrode layers are placed at the top and bottom of said piezoelectric diaphragm, and a drive voltage is applied to each piezoelectric layer via the electrode layers disposed to interpose said piezoelectric layer therebetween.

37. A piezoelectric actuator as in claim 5, wherein said piezoelectric diaphragm comprises alternately laminated electrode layers and piezoelectric layers in the direction of width of said piezoelectric diaphragm so that electrode layers are placed at the top and bottom of said piezoelectric diaphragm, and a drive voltage is applied to each piezoelectric layer via the electrode layers disposed to interpose said piezoelectric layer therebetween.

38. A piezoelectric actuator as in claim 2, wherein said piezoelectric diaphragm comprises alternately laminated electrode layers and piezoelectric layers in the longitudinal direction of said piezoelectric diaphragm so that electrode layers are placed both end faces of said piezoelectric diaphragm, and a drive voltage is applied to each piezoelectric layer via said electrode layers disposed to interpose said piezoelectric layer therebetween.

39. A piezoelectric actuator as in claim 3, wherein said piezoelectric diaphragm comprises alternately laminated electrode layers and piezoelectric layers in the longitudinal direction of said piezoelectric diaphragm so that electrode layers are placed both end faces of said piezoelectric diaphragm, and a drive voltage is applied to each piezoelectric layer via said electrode layers disposed to interpose said piezoelectric layer therebetween.

40. A piezoelectric actuator as in claim 4, wherein said piezoelectric diaphragm comprises alternately laminated electrode layers and piezoelectric layers in the longitudinal direction of said piezoelectric diaphragm so that electrode layers are placed both end faces of said piezoelectric diaphragm, and a drive voltage is applied to each piezoelectric layer via said electrode layers disposed to interpose said piezoelectric layer therebetween.

41. A piezoelectric actuator as in claim 5, wherein said piezoelectric diaphragm comprises alternately laminated electrode layers and piezoelectric layers in the longitudinal direction of said piezoelectric diaphragm so that electrode layers are placed both end faces of said piezoelectric diaphragm, and a drive voltage is applied to each piezoelectric layer via said electrode layers disposed to interpose said piezoelectric layer therebetween.

42. A piezoelectric actuator as in claim 2, wherein the resonance frequency of said drive section and the resonance frequency of said displacement amplifying section are set so that the lower resonance frequency is 0.6 times the higher resonance frequency or higher, and the frequency of the drive voltage is set to a value between the resonance frequency of said drive section and the resonance frequency of said displacement amplifying section.

43. A piezoelectric actuator as in claim 3, wherein the resonance frequency of said drive section and the resonance frequency of said displacement amplifying section are set so that the lower resonance frequency is 0.6 times the higher resonance frequency or higher, and the frequency of the drive voltage is set to a value between the resonance frequency of said drive section and the resonance frequency of said displacement amplifying section.

44. A piezoelectric actuator as in claim 4, wherein the resonance frequency of said drive section and the resonance frequency of said displacement amplifying section are set so that the lower resonance frequency is 0.6 times the higher resonance frequency or higher, and the frequency of the drive voltage is set to a value between the resonance frequency of said drive section and the resonance frequency of said displacement amplifying section.

45. A piezoelectric actuator as in claim 5, wherein the resonance frequency of said drive section and the resonance frequency of said displacement amplifying section are set so that the lower resonance frequency is 0.6 times the higher resonance frequency or higher, and the frequency of the drive voltage is set to a value between the resonance frequency of said drive section and the resonance frequency of said displacement amplifying section.

46. A piezoelectric actuator as in claim 2, wherein the resonance frequency of said drive section is set higher than the resonance frequency of said displacement amplifying section, and the frequency of the drive voltage is set to a frequency not higher than the resonance frequency of said displacement amplifying section.

47. A piezoelectric actuator as in claim 3, wherein the resonance frequency of said drive section is set higher than the resonance frequency of said displacement amplifying section, and the frequency of the drive voltage is set to a frequency not higher than the resonance frequency of said displacement amplifying section.

48. A piezoelectric actuator as in claim 4, wherein the resonance frequency of said drive section is set higher than the resonance frequency of said displacement amplifying section, and the frequency of the drive voltage is set to a frequency not higher than the resonance frequency of said displacement amplifying section.

49. A piezoelectric actuator as in claim 5, wherein the resonance frequency of said drive section is set higher than the resonance frequency of said displacement amplifying section, and the frequency of the drive voltage is set to a frequency not higher than the resonance frequency of said displacement amplifying section.

* * * * *